United States Patent
Yan et al.

(10) Patent No.: US 7,566,664 B2
(45) Date of Patent: Jul. 28, 2009

(54) SELECTIVE ETCHING OF MEMS USING GASEOUS HALIDES AND REACTIVE CO-ETCHANTS

(75) Inventors: Xiaoming Yan, Sunnyvale, CA (US); Brian Arbuckle, Danville, CA (US); Evgeni Gousev, Saratoga, CA (US); Ming-Hau Tung, San Francisco, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 224 days.

(21) Appl. No.: 11/497,726

(22) Filed: Aug. 2, 2006

(65) Prior Publication Data

US 2008/0032439 A1 Feb. 7, 2008

(51) Int. Cl.
*H01L 21/20* (2006.01)
(52) U.S. Cl. .................... 438/706; 438/687; 438/738; 257/E21.218; 257/E21.252
(58) Field of Classification Search ......... 438/706–707, 438/711, 714, 687, 738; 257/E21.218, 252, 257/586
See application file for complete search history.

(56) References Cited

U.S. PATENT DOCUMENTS

| | | | |
|---|---|---|---|
| 2,534,846 | A | 12/1950 | Ambrose et al. |
| 3,439,973 | A | 4/1969 | Paul et al. |
| 3,443,854 | A | 5/1969 | Weiss |
| 3,616,312 | A | 10/1971 | McGriff et al. |
| 3,653,741 | A | 4/1972 | Marks |
| 3,656,836 | A | 4/1972 | de Cremoux et al. |
| 3,725,868 | A | 4/1973 | Malmer, Jr. et al. |
| 3,813,265 | A | 5/1974 | Marks |
| 3,955,880 | A | 5/1976 | Lierke |
| 4,099,854 | A | 7/1978 | Decker et al. |
| 4,196,396 | A | 4/1980 | Smith |
| 4,228,437 | A | 10/1980 | Shelton |

(Continued)

FOREIGN PATENT DOCUMENTS

CH 680534 9/1992

(Continued)

OTHER PUBLICATIONS

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).

(Continued)

*Primary Examiner*—Michael S Lebentritt
(74) *Attorney, Agent, or Firm*—Knobbe, Martens, Olson & Bear, LLP

(57) ABSTRACT

A method for etching a target material in the presence of a structural material with improved selectivity uses a vapor phase etchant and a co-etchant. Embodiments of the method exhibit improved selectivities of from at least about 2-times to at least about 100-times compared with a similar etching process not using a co-etchant. In some embodiments, the target material comprises a metal etchable by the vapor phase etchant. Embodiments of the method are particularly useful in the manufacture of MEMS devices, for example, interferometric modulators. In some embodiments, the target material comprises a metal etchable by the vapor phase etchant, for example, molybdenum and the structural material comprises a dielectric, for example silicon dioxide.

37 Claims, 15 Drawing Sheets

U.S. PATENT DOCUMENTS

| | | |
|---|---|---|
| 4,377,324 A | 3/1983 | Durand et al. |
| 4,389,096 A | 6/1983 | Hori et al. |
| 4,392,711 A | 7/1983 | Moraw et al. |
| 4,403,248 A | 9/1983 | te Velde |
| 4,441,791 A | 4/1984 | Hornbeck |
| 4,445,050 A | 4/1984 | Marks |
| 4,459,182 A | 7/1984 | te Velde |
| 4,482,213 A | 11/1984 | Piliavin et al. |
| 4,500,171 A | 2/1985 | Penz et al. |
| 4,519,676 A | 5/1985 | te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,617,608 A | 10/1986 | Blonder et al. |
| 4,662,746 A | 5/1987 | Hornbeck |
| 4,663,083 A | 5/1987 | Marks |
| 4,681,403 A | 7/1987 | te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,859,060 A | 8/1989 | Katagiri et al. |
| 4,863,245 A | 9/1989 | Roxlo |
| 4,900,136 A | 2/1990 | Goldburt et al. |
| 4,900,395 A | 2/1990 | Syverson et al. |
| 4,937,496 A | 6/1990 | Neiger et al. |
| 4,954,789 A | 9/1990 | Sampsell |
| 4,956,619 A | 9/1990 | Hornbeck |
| 4,965,562 A | 10/1990 | Verhulst |
| 4,982,184 A | 1/1991 | Kirkwood |
| 5,018,256 A | 5/1991 | Hornbeck |
| 5,022,745 A | 6/1991 | Zahowski et al. |
| 5,028,939 A | 7/1991 | Hornbeck et al. |
| 5,030,319 A | 7/1991 | Nishino et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,212,582 A | 5/1993 | Nelson |
| 5,214,419 A | 5/1993 | DeMond et al. |
| 5,214,420 A | 5/1993 | Thompson et al. |
| 5,216,537 A | 6/1993 | Hornbeck |
| 5,218,472 A | 6/1993 | Jozefowicz et al. |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,293,272 A | 3/1994 | Jannon et al. |
| 5,296,950 A | 3/1994 | Lin et al. |
| 5,299,041 A | 3/1994 | Morin et al. |
| 5,305,640 A | 4/1994 | Boysel et al. |
| 5,311,360 A | 5/1994 | Bloom et al. |
| 5,312,512 A | 5/1994 | Allman et al. |
| 5,312,513 A | 5/1994 | Florence et al. |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,330,617 A | 7/1994 | Haond |
| 5,331,454 A | 7/1994 | Hornbeck |
| 5,339,116 A | 8/1994 | Urbanus et al. |
| 5,345,328 A | 9/1994 | Fritz et al. |
| 5,347,377 A | 9/1994 | Revelli, Jr. et al. |
| 5,355,357 A | 10/1994 | Yamamori et al. |
| 5,358,601 A | 10/1994 | Cathey |
| 5,365,283 A | 11/1994 | Doherty et al. |
| 5,381,232 A | 1/1995 | van Wijk |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,474,865 A | 12/1995 | Vasudev |
| 5,488,505 A | 1/1996 | Engle |
| 5,489,952 A | 2/1996 | Gove et al. |
| 5,497,172 A | 3/1996 | Doherty et al. |
| 5,497,197 A | 3/1996 | Gove et al. |
| 5,499,037 A | 3/1996 | Nakagawa et al. |
| 5,499,062 A | 3/1996 | Urbanus |
| 5,500,635 A | 3/1996 | Mott |
| 5,500,761 A | 3/1996 | Goossen et al. |
| 5,503,952 A | 4/1996 | Suzuki et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,327 A | 6/1996 | Cordova, Jr. |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,563,398 A | 10/1996 | Sampsell |
| 5,567,334 A | 10/1996 | Baker et al. |
| 5,570,135 A | 10/1996 | Gove et al. |
| 5,578,976 A | 11/1996 | Yao |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |

| Patent No. | Date | Inventor |
|---|---|---|
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |
| 5,619,059 A | 4/1997 | Li et al. |
| 5,619,365 A | 4/1997 | Rhoades et al. |
| 5,619,366 A | 4/1997 | Rhoads et al. |
| 5,622,814 A | 4/1997 | Miyata et al. |
| 5,629,790 A | 5/1997 | Neukermans et al. |
| 5,633,652 A | 5/1997 | Kanbe et al. |
| 5,636,052 A | 6/1997 | Arney et al. |
| 5,636,185 A | 6/1997 | Brewer et al. |
| 5,638,084 A | 6/1997 | Kalt |
| 5,638,946 A | 6/1997 | Zavracky |
| 5,641,391 A | 6/1997 | Hunter et al. |
| 5,646,768 A | 7/1997 | Kaeriyama |
| 5,647,819 A | 7/1997 | Fujita et al. |
| 5,650,834 A | 7/1997 | Nakagawa et al. |
| 5,650,881 A | 7/1997 | Hornbeck |
| 5,654,741 A | 8/1997 | Sampsell et al. |
| 5,657,099 A | 8/1997 | Doherty et al. |
| 5,659,374 A | 8/1997 | Gale, Jr. et al. |
| 5,665,997 A | 9/1997 | Weaver et al. |
| 5,673,139 A | 9/1997 | Johnson |
| 5,674,757 A | 10/1997 | Kim |
| 5,683,591 A | 11/1997 | Offenberg |
| 5,703,710 A | 12/1997 | Brinkman et al. |
| 5,706,022 A | 1/1998 | Hato |
| 5,710,656 A | 1/1998 | Goossen |
| 5,726,480 A | 3/1998 | Pister |
| 5,737,050 A | 4/1998 | Takahara et al. |
| 5,739,945 A | 4/1998 | Tayebati |
| 5,745,193 A | 4/1998 | Urbanus et al. |
| 5,745,281 A | 4/1998 | Yi et al. |
| 5,759,334 A | 6/1998 | Kojima et al. |
| 5,771,116 A | 6/1998 | Miller et al. |
| 5,771,321 A | 6/1998 | Stern |
| 5,784,189 A | 7/1998 | Bozler et al. |
| 5,784,190 A | 7/1998 | Worley |
| 5,784,212 A | 7/1998 | Hornbeck |
| 5,785,877 A | 7/1998 | Sato et al. |
| 5,793,504 A | 8/1998 | Stoll |
| 5,808,780 A | 9/1998 | McDonald |
| 5,818,095 A | 10/1998 | Sampsell |
| 5,822,170 A | 10/1998 | Cabuz et al. |
| 5,824,608 A | 10/1998 | Gotoh et al. |
| 5,825,528 A | 10/1998 | Goosen |
| 5,835,255 A | 11/1998 | Miles |
| 5,835,256 A | 11/1998 | Huibers |
| 5,838,484 A | 11/1998 | Gossen et al. |
| 5,842,088 A | 11/1998 | Thompson |
| 5,867,302 A | 2/1999 | Fleming et al. |
| 5,906,536 A | 5/1999 | Imazato et al. |
| 5,912,758 A | 6/1999 | Knipe et al. |
| 5,943,158 A | 8/1999 | Ford et al. |
| 5,945,980 A | 8/1999 | Moissey et al. |
| 5,959,763 A | 9/1999 | Bozler et al. |
| 5,967,163 A | 10/1999 | Pan et al. |
| 5,972,193 A | 10/1999 | Chou et al. |
| 5,976,902 A | 11/1999 | Shih |
| 5,986,796 A | 11/1999 | Miles et al. |
| 5,994,174 A | 11/1999 | Carey et al. |
| 6,016,693 A | 1/2000 | Viani et al. |
| 6,028,690 A | 2/2000 | Carter et al. |
| 6,031,653 A | 2/2000 | Wang |
| 6,038,056 A | 3/2000 | Florence et al. |
| 6,040,937 A | 3/2000 | Miles |
| 6,049,317 A | 4/2000 | Thompson et al. |
| 6,055,090 A | 4/2000 | Miles et al. |
| 6,057,903 A | 5/2000 | Colgan et al. |
| 6,061,075 A | 5/2000 | Nelson et al. |
| 6,088,162 A | 7/2000 | Someno |
| 6,097,145 A | 8/2000 | Kastalsky et al. |
| 6,099,132 A | 8/2000 | Kaeriyama |
| 6,100,872 A | 8/2000 | Aratani et al. |
| 6,113,239 A | 9/2000 | Sampsell et al. |
| 6,115,326 A | 9/2000 | Puma et al. |
| 6,136,630 A | 10/2000 | Weigold |
| 6,137,150 A | 10/2000 | Takeuchi et al. |
| 6,147,790 A | 11/2000 | Meier et al. |
| 6,158,156 A | 12/2000 | Patrick |
| 6,160,833 A | 12/2000 | Floyd et al. |
| 6,166,422 A | 12/2000 | Qian et al. |
| 6,171,945 B1 | 1/2001 | Mandal et al. |
| 6,180,428 B1 | 1/2001 | Peeters et al. |
| 6,194,323 B1 | 2/2001 | Downey et al. |
| 6,195,196 B1 | 2/2001 | Kimura et al. |
| 6,201,633 B1 | 3/2001 | Peeters et al. |
| 6,204,080 B1 | 3/2001 | Hwang |
| 6,215,221 B1 | 4/2001 | Cabuz et al. |
| 6,232,936 B1 | 5/2001 | Gove et al. |
| 6,243,149 B1 | 6/2001 | Swanson et al. |
| 6,246,398 B1 | 6/2001 | Koo |
| 6,249,039 B1 | 6/2001 | Harvey et al. |
| 6,275,220 B1 | 8/2001 | Nitta |
| 6,282,010 B1 | 8/2001 | Sulzbach et al. |
| 6,284,560 B1 | 9/2001 | Jech et al. |
| 6,288,824 B1 | 9/2001 | Kastalsky et al. |
| 6,295,154 B1 | 9/2001 | Laor et al. |
| 6,297,072 B1 | 10/2001 | Tilmans et al. |
| 6,323,982 B1 | 11/2001 | Hornbeck |
| 6,327,071 B1 | 12/2001 | Kimura et al. |
| 6,329,297 B1 | 12/2001 | Balish et al. |
| 6,333,556 B1 | 12/2001 | Juengling et al. |
| 6,335,831 B2 | 1/2002 | Kowarz et al. |
| 6,340,435 B1 | 1/2002 | Bjorkman et al. |
| 6,351,329 B1 | 2/2002 | Greywall |
| 6,356,254 B1 | 3/2002 | Kimura |
| 6,376,787 B1 | 4/2002 | Martin et al. |
| 6,391,675 B1 | 5/2002 | Ehmke et al. |
| 6,392,233 B1 | 5/2002 | Channin et al. |
| 6,392,781 B1 | 5/2002 | Kim et al. |
| 6,407,851 B1 | 6/2002 | Islam et al. |
| 6,424,094 B1 | 7/2002 | Feldman |
| 6,447,126 B1 | 9/2002 | Hornbeck |
| 6,449,084 B1 | 9/2002 | Guo |
| 6,452,124 B1 | 9/2002 | York et al. |
| 6,452,465 B1 | 9/2002 | Brown et al. |
| 6,456,420 B1 | 9/2002 | Goodwin-Johansson |
| 6,465,355 B1 | 10/2002 | Horsley |
| 6,466,354 B1 | 10/2002 | Gudeman |
| 6,466,358 B2 | 10/2002 | Tew |
| 6,473,274 B1 | 10/2002 | Maimone et al. |
| 6,480,177 B2 | 11/2002 | Doherty et al. |
| 6,496,122 B2 | 12/2002 | Sampsell |
| 6,513,911 B1 | 2/2003 | Ozaki et al. |
| 6,522,801 B1 | 2/2003 | Aksyuk et al. |
| 6,531,945 B1 | 3/2003 | Ahn et al. |
| 6,545,335 B1 | 4/2003 | Chua et al. |
| 6,548,908 B2 | 4/2003 | Chua et al. |
| 6,549,195 B2 | 4/2003 | Hikida et al. |
| 6,549,338 B1 | 4/2003 | Wolverton et al. |
| 6,552,840 B2 | 4/2003 | Knipe |
| 6,574,033 B1 | 6/2003 | Chen et al. |
| 6,577,785 B1 | 6/2003 | Spahn et al. |
| 6,589,625 B1 | 7/2003 | Kothari et al. |
| 6,600,201 B1 | 7/2003 | Hartwell et al. |
| 6,606,175 B1 | 8/2003 | Sampsell et al. |
| 6,608,268 B1 | 8/2003 | Goldsmith |
| 6,610,440 B1 | 8/2003 | LaFollette et al. |
| 6,624,944 B1 | 9/2003 | Wallace et al. |
| 6,625,047 B2 | 9/2003 | Coleman, Jr. |
| 6,630,786 B2 | 10/2003 | Cummings et al. |
| 6,632,698 B2 | 10/2003 | Ives |
| 6,635,919 B1 | 10/2003 | Melendez et al. |

| | | | | | | |
|---|---|---|---|---|---|---|
| 6,639,724 | B2 | 10/2003 | Bower et al. | 7,123,216 | B1 | 10/2006 | Miles |
| 6,642,913 | B1 | 11/2003 | Kimura et al. | 7,161,730 | B2 | 1/2007 | Floyd |
| 6,643,069 | B2 | 11/2003 | Dewald | 7,172,915 | B2 | 2/2007 | Lin et al. |
| 6,650,455 | B2 | 11/2003 | Miles | 7,250,315 | B2 | 7/2007 | Miles |
| 6,653,997 | B2 | 11/2003 | Van Gorkom et al. | 7,256,922 | B2 | 8/2007 | Chui et al. |
| 6,657,832 | B2 | 12/2003 | Williams et al. | 7,259,865 | B2 | 8/2007 | Cummings et al. |
| 6,660,656 | B2 | 12/2003 | Cheung et al. | 7,323,217 | B2 | 1/2008 | Lin et al. |
| 6,666,561 | B1 | 12/2003 | Blakley | 7,369,292 | B2 | 5/2008 | Xu et al. |
| 6,674,562 | B1 | 1/2004 | Miles et al. | 7,369,296 | B2 | 5/2008 | Floyd |
| 6,674,563 | B2 | 1/2004 | Chui et al. | 7,373,026 | B2 | 5/2008 | Chui |
| 6,680,792 | B2 | 1/2004 | Miles | 2001/0003487 | A1 | 6/2001 | Miles |
| 6,687,896 | B1 | 3/2004 | Miles | 2001/0010953 | A1 | 8/2001 | Kang et al. |
| 6,710,908 | B2 | 3/2004 | Miles et al. | 2001/0026951 | A1 | 10/2001 | Vergani et al. |
| 6,720,267 | B1 | 4/2004 | Chen et al. | 2001/0040649 | A1 | 11/2001 | Ozaki |
| 6,736,987 | B1* | 5/2004 | Cho .................... 216/58 | 2001/0040675 | A1 | 11/2001 | True et al. |
| 6,741,377 | B2 | 5/2004 | Miles | 2001/0055208 | A1 | 12/2001 | Kimura |
| 6,741,384 | B1 | 5/2004 | Martin et al. | 2002/0015215 | A1 | 2/2002 | Miles |
| 6,741,503 | B1 | 5/2004 | Farris et al. | 2002/0021485 | A1 | 2/2002 | Pilossof |
| 6,743,570 | B2 | 6/2004 | Harnett et al. | 2002/0024711 | A1 | 2/2002 | Miles |
| 6,747,785 | B2 | 6/2004 | Chen et al. | 2002/0036304 | A1 | 3/2002 | Ehmke et al. |
| 6,747,800 | B1 | 6/2004 | Lin | 2002/0054424 | A1 | 5/2002 | Miles |
| 6,756,317 | B2 | 6/2004 | Sniegowski et al. | 2002/0055253 | A1 | 5/2002 | Rudhard |
| 6,768,097 | B1 | 7/2004 | Viktorovitch et al. | 2002/0058422 | A1* | 5/2002 | Jang et al. .................... 438/745 |
| 6,775,174 | B2 | 8/2004 | Huffman et al. | 2002/0070931 | A1 | 6/2002 | Ishikawa |
| 6,778,155 | B2 | 8/2004 | Doherty et al. | 2002/0071169 | A1 | 6/2002 | Bowers et al. |
| 6,778,306 | B2 | 8/2004 | Sniegowski et al. | 2002/0075555 | A1 | 6/2002 | Miles |
| 6,791,441 | B2 | 9/2004 | Pillans et al. | 2002/0086455 | A1 | 7/2002 | Franosch et al. |
| 6,791,692 | B2 | 9/2004 | Powell et al. | 2002/0109899 | A1 | 8/2002 | Ohtaka et al. |
| 6,794,119 | B2 | 9/2004 | Miles | 2002/0126364 | A1 | 9/2002 | Miles |
| 6,803,534 | B1 | 10/2004 | Chen et al. | 2002/0135857 | A1 | 9/2002 | Fitzpatrick et al. |
| 6,809,788 | B2 | 10/2004 | Yamada et al. | 2002/0137072 | A1 | 9/2002 | Mirkin et al. |
| 6,811,267 | B1 | 11/2004 | Allen et al. | 2002/0149828 | A1 | 10/2002 | Miles |
| 6,812,482 | B2 | 11/2004 | Fleming et al. | 2002/0149850 | A1 | 10/2002 | Heffner et al. |
| 6,814,814 | B2 | 11/2004 | Collins et al. | 2002/0167072 | A1 | 11/2002 | Andosca |
| 6,819,469 | B1 | 11/2004 | Koba | 2002/0168136 | A1 | 11/2002 | Atia et al. |
| 6,822,628 | B2 | 11/2004 | Dunphy et al. | 2002/0171610 | A1 | 11/2002 | Siwinski et al. |
| 6,829,132 | B2 | 12/2004 | Martin et al. | 2002/0186209 | A1 | 12/2002 | Cok |
| 6,844,959 | B2 | 1/2005 | Huibers et al. | 2002/0195681 | A1 | 12/2002 | Melendez et al. |
| 6,853,129 | B1 | 2/2005 | Cummings et al. | 2003/0003372 | A1 | 1/2003 | Hutchinson |
| 6,855,610 | B2 | 2/2005 | Tung et al. | 2003/0006468 | A1 | 1/2003 | Ma et al. |
| 6,858,080 | B2 | 2/2005 | Linares et al. | 2003/0007107 | A1 | 1/2003 | Chae |
| 6,859,218 | B1 | 2/2005 | Luman et al. | 2003/0021004 | A1 | 1/2003 | Cunningham et al. |
| 6,859,301 | B1 | 2/2005 | Islam et al. | 2003/0043157 | A1 | 3/2003 | Miles |
| 6,861,277 | B1 | 3/2005 | Monroe et al. | 2003/0053078 | A1 | 3/2003 | Missey et al. |
| 6,862,022 | B2 | 3/2005 | Slupe | 2003/0054588 | A1 | 3/2003 | Patel et al. |
| 6,862,029 | B1 | 3/2005 | D'Souza et al. | 2003/0062186 | A1 | 4/2003 | Boroson et al. |
| 6,867,896 | B2 | 3/2005 | Miles | 2003/0072070 | A1 | 4/2003 | Miles |
| 6,870,581 | B2 | 3/2005 | Li et al. | 2003/0073042 | A1 | 4/2003 | Cernigliaro et al. |
| 6,870,654 | B2 | 3/2005 | Lin et al. | 2003/0077843 | A1 | 4/2003 | Yamauchi et al. |
| 6,882,458 | B2 | 4/2005 | Lin et al. | 2003/0090350 | A1 | 5/2003 | Feng et al. |
| 6,882,461 | B1 | 4/2005 | Tsai et al. | 2003/0102771 | A1 | 6/2003 | Akiba et al. |
| 6,905,621 | B2 | 6/2005 | Ho et al. | 2003/0112096 | A1 | 6/2003 | Potter |
| 6,906,847 | B2 | 6/2005 | Huibers et al. | 2003/0118920 | A1 | 6/2003 | Johnstone et al. |
| 6,912,022 | B2 | 6/2005 | Lin et al. | 2003/0132822 | A1 | 7/2003 | Ko et al. |
| 6,913,942 | B2* | 7/2005 | Patel et al. .................... 438/48 | 2003/0138213 | A1 | 7/2003 | Jin et al. |
| 6,919,274 | B2* | 7/2005 | Kazumi et al. ............... 438/687 | 2003/0152872 | A1 | 8/2003 | Miles |
| 6,939,472 | B2* | 9/2005 | Schaadt et al. ................. 216/2 | 2003/0164350 | A1 | 9/2003 | Hanson et al. |
| 6,940,631 | B2 | 9/2005 | Ishikawa | 2003/0201784 | A1 | 10/2003 | Potter |
| 6,947,200 | B2 | 9/2005 | Huibers | 2003/0202264 | A1 | 10/2003 | Weber et al. |
| 6,949,202 | B1* | 9/2005 | Patel et al. .................... 216/58 | 2003/0202265 | A1 | 10/2003 | Reboa et al. |
| 6,952,303 | B2 | 10/2005 | Lin et al. | 2003/0202266 | A1 | 10/2003 | Ring et al. |
| 6,958,847 | B2 | 10/2005 | Lin | 2003/0231373 | A1 | 12/2003 | Kowarz |
| 6,980,350 | B2 | 12/2005 | Hung et al. | 2004/0010115 | A1 | 1/2004 | Sotzing |
| 6,982,820 | B2 | 1/2006 | Tsai | 2004/0027636 | A1 | 2/2004 | Miles |
| 6,995,890 | B2 | 2/2006 | Lin | 2004/0027701 | A1 | 2/2004 | Ishikawa |
| 6,999,225 | B2 | 2/2006 | Lin | 2004/0028849 | A1 | 2/2004 | Stark et al. |
| 6,999,236 | B2 | 2/2006 | Lin | 2004/0035821 | A1 | 2/2004 | Doan et al. |
| 7,016,099 | B2 | 3/2006 | Ikeda et al. | 2004/0051929 | A1 | 3/2004 | Sampsell et al. |
| 7,027,200 | B2* | 4/2006 | Shi et al. .................... 359/290 | 2004/0053434 | A1 | 3/2004 | Bruner |
| 7,041,224 | B2* | 5/2006 | Patel et al. .................... 216/2 | 2004/0058531 | A1 | 3/2004 | Hsieh et al. |
| 7,064,089 | B2 | 6/2006 | Yamazaki et al. | 2004/0058532 | A1 | 3/2004 | Miles et al. |
| 7,078,293 | B2 | 7/2006 | Lin et al. | 2004/0061543 | A1 | 4/2004 | Nam et al. |
| 7,110,158 | B2 | 9/2006 | Miles | 2004/0063322 | A1 | 4/2004 | Yang |

| | | |
|---|---|---|
| 2004/0080035 A1 | 4/2004 | Delapierre |
| 2004/0080807 A1 | 4/2004 | Chen et al. |
| 2004/0080832 A1 | 4/2004 | Singh |
| 2004/0087086 A1 | 5/2004 | Lee |
| 2004/0100594 A1 | 5/2004 | Huibers et al. |
| 2004/0100677 A1 | 5/2004 | Huibers et al. |
| 2004/0124073 A1 | 7/2004 | Pilans et al. |
| 2004/0125281 A1 | 7/2004 | Lin et al. |
| 2004/0125282 A1 | 7/2004 | Lin et al. |
| 2004/0125536 A1 | 7/2004 | Arney et al. |
| 2004/0136076 A1 | 7/2004 | Tayebati |
| 2004/0145049 A1 | 7/2004 | McKinnell et al. |
| 2004/0145811 A1 | 7/2004 | Lin et al. |
| 2004/0147056 A1 | 7/2004 | McKinnell et al. |
| 2004/0147198 A1 | 7/2004 | Lin et al. |
| 2004/0148009 A1 | 7/2004 | Buzzard |
| 2004/0150869 A1 | 8/2004 | Kasai |
| 2004/0150915 A1 | 8/2004 | Thomas et al. |
| 2004/0150939 A1 | 8/2004 | Huff |
| 2004/0160143 A1 | 8/2004 | Shreeve et al. |
| 2004/0163758 A1 | 8/2004 | Kagan et al. |
| 2004/0174583 A1 | 9/2004 | Chen et al. |
| 2004/0175577 A1 | 9/2004 | Lin et al. |
| 2004/0179281 A1 | 9/2004 | Reboa |
| 2004/0179445 A1 | 9/2004 | Park |
| 2004/0191937 A1 | 9/2004 | Patel et al. |
| 2004/0191946 A1 | 9/2004 | Patel et al. |
| 2004/0207897 A1 | 10/2004 | Lin |
| 2004/0209192 A1 | 10/2004 | Lin et al. |
| 2004/0209195 A1 | 10/2004 | Lin |
| 2004/0212026 A1 | 10/2004 | Van Brocklin et al. |
| 2004/0217378 A1 | 11/2004 | Martin et al. |
| 2004/0217919 A1 | 11/2004 | Pichl et al. |
| 2004/0218251 A1 | 11/2004 | Piehl et al. |
| 2004/0218334 A1 | 11/2004 | Martin et al. |
| 2004/0218341 A1 | 11/2004 | Martin et al. |
| 2004/0227493 A1 | 11/2004 | Van Brocklin et al. |
| 2004/0233503 A1 | 11/2004 | Kimura |
| 2004/0240027 A1 | 12/2004 | Lin et al. |
| 2004/0240032 A1 | 12/2004 | Miles |
| 2004/0240138 A1 | 12/2004 | Martin et al. |
| 2004/0245588 A1 | 12/2004 | Nikkel et al. |
| 2004/0263944 A1 | 12/2004 | Miles et al. |
| 2005/0001828 A1 | 1/2005 | Martin et al. |
| 2005/0003667 A1 | 1/2005 | Lin et al. |
| 2005/0012577 A1 | 1/2005 | Pillans et al. |
| 2005/0012975 A1 | 1/2005 | George et al. |
| 2005/0020089 A1 | 1/2005 | Shi et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0036192 A1 | 2/2005 | Lin et al. |
| 2005/0038950 A1 | 2/2005 | Adelmann |
| 2005/0042117 A1 | 2/2005 | Lin |
| 2005/0046919 A1 | 3/2005 | Taguchi et al. |
| 2005/0046922 A1 | 3/2005 | Lin et al. |
| 2005/0046948 A1 | 3/2005 | Lin |
| 2005/0057442 A1 | 3/2005 | Way |
| 2005/0068583 A1 | 3/2005 | Gutkowski et al. |
| 2005/0068605 A1 | 3/2005 | Tsai |
| 2005/0068606 A1 | 3/2005 | Tsai |
| 2005/0069209 A1 | 3/2005 | Damera-Venkata et al. |
| 2005/0078348 A1 | 4/2005 | Lin |
| 2005/0128565 A1 | 6/2005 | Ljungblad |
| 2005/0168849 A1 | 8/2005 | Lin |
| 2005/0195462 A1 | 9/2005 | Lin |
| 2005/0195467 A1 | 9/2005 | Kothari et al. |
| 2005/0202649 A1 | 9/2005 | Hung et al. |
| 2005/0249966 A1 | 11/2005 | Tung et al. |
| 2005/0250235 A1 | 11/2005 | Miles et al. |
| 2005/0253820 A1 | 11/2005 | Horiuchi |
| 2006/0024880 A1 | 2/2006 | Chui et al. |
| 2006/0050393 A1 | 3/2006 | Lin et al. |
| 2006/0056001 A1 | 3/2006 | Taguchi et al. |
| 2006/0066511 A1 | 3/2006 | Chui |
| 2006/0066932 A1 | 3/2006 | Chui |
| 2006/0066935 A1 | 3/2006 | Cummings et al. |
| 2006/0067644 A1 | 3/2006 | Chui et al. |
| 2006/0067646 A1 | 3/2006 | Chui |
| 2006/0077528 A1 | 4/2006 | Floyd |
| 2006/0096705 A1* | 5/2006 | Shi et al. ............... 156/345.33 |
| 2006/0209386 A1 | 9/2006 | Sudak et al. |
| 2006/0261330 A1 | 11/2006 | Miles |
| 2007/0096300 A1 | 5/2007 | Wang et al. |
| 2007/0103028 A1 | 5/2007 | Lewis et al. |
| 2007/0121205 A1 | 5/2007 | Miles |
| 2007/0206267 A1 | 9/2007 | Tung et al. |
| 2007/0236774 A1 | 10/2007 | Gousev et al. |
| 2007/0285761 A1 | 12/2007 | Zhong et al. |
| 2008/0030825 A1 | 2/2008 | Sasagawa et al. |
| 2008/0093688 A1 | 4/2008 | Cummings et al. |
| 2008/0144163 A1 | 6/2008 | Floyd |
| 2008/0158645 A1 | 7/2008 | Chiang |

FOREIGN PATENT DOCUMENTS

| | | |
|---|---|---|
| CH | 681 047 | 12/1992 |
| CN | 092109265 | 11/2003 |
| DE | 199 38 072 | 3/2000 |
| DE | 102 28 946 A | 1/2004 |
| DE | 198 47 455 | 4/2004 |
| EP | 0 035 299 | 9/1983 |
| EP | 0173808 | 3/1986 |
| EP | 0 667 548 A1 | 8/1995 |
| EP | 0694801 A | 1/1996 |
| EP | 0695959 A | 2/1996 |
| EP | 0878824 | 11/1998 |
| EP | 1 170 618 | 1/2002 |
| EP | 1197778 A | 4/2002 |
| EP | 1 243 550 | 9/2002 |
| EP | 1258860 A1 | 11/2002 |
| EP | 1 452 481 A | 9/2004 |
| EP | 1 640 317 A2 | 3/2006 |
| JP | 157313 | 5/1991 |
| JP | 05275401 A1 | 10/1993 |
| JP | 6-281956 | 10/1994 |
| JP | 7-45550 | 2/1995 |
| JP | 09-036387 | 2/1997 |
| JP | 10500224 | 1/1998 |
| JP | 10-116996 | 5/1998 |
| JP | 10-148644 | 6/1998 |
| JP | 10-267658 | 10/1998 |
| JP | 11-097799 | 4/1999 |
| JP | 11211999 A | 8/1999 |
| JP | 11-263012 | 9/1999 |
| JP | 11243214 | 9/1999 |
| JP | 2000-40831 A | 2/2000 |
| JP | 2002 062493 | 2/2002 |
| JP | 2002-270575 | 9/2002 |
| JP | 2002-296521 | 10/2002 |
| JP | 2002-341267 | 11/2002 |
| JP | 2002-355800 | 12/2002 |
| JP | 2003-001598 | 1/2003 |
| JP | 2003-057571 | 2/2003 |
| JP | 2003195201 | 7/2003 |
| JP | 2004-102022 A | 4/2004 |
| JP | 2004106074 A | 4/2004 |
| JP | 2004-212656 | 7/2004 |
| JP | 2005-005696 | 1/2005 |
| JP | 2005-051007 | 2/2005 |
| KR | 2002-9270 | 10/1999 |
| KR | 2000-0033006 | 6/2000 |
| WO | WO 92/10925 | 6/1992 |
| WO | WO9530924 | 11/1995 |
| WO | WO9717628 | 5/1997 |
| WO | WO 98/29748 | 7/1998 |

| | | |
|---|---|---|
| WO | WO9952006 A2 | 10/1999 |
| WO | WO9952006 A3 | 10/1999 |
| WO | WO 01/14248 | 3/2001 |
| WO | WO 01/63657 | 8/2001 |
| WO | WO 02/24570 | 3/2002 |
| WO | WO 03/007049 A1 | 1/2003 |
| WO | WO 03/046508 | 6/2003 |
| WO | WO 03/052506 | 6/2003 |
| WO | WO 03/069413 A | 8/2003 |
| WO | WO03073151 A1 | 9/2003 |
| WO | WO 03/085728 | 10/2003 |
| WO | WO 04/000717 | 12/2003 |
| WO | WO2004006003 A1 | 1/2004 |
| WO | WO 2004/015741 | 2/2004 |
| WO | WO2004026757 A2 | 4/2004 |
| WO | WO 2005/019899 A1 | 3/2005 |
| WO | WO 2005/061378 | 7/2005 |
| WO | WO 2005/066596 | 7/2005 |
| WO | WO 2005/085932 A | 9/2005 |
| WO | WO 2005/124869 | 12/2005 |
| WO | WO 2006/036385 | 4/2006 |
| WO | WO 2006/036437 | 4/2006 |
| WO | WO2006/036542 | 4/2006 |

OTHER PUBLICATIONS

Aratani et al., "Surface micromachined tuneable interferometer array," Sensors and Actuators, pp. 17-23. (1994).
Akasaka, "Three-Dimensional IC Trends," Proceedings of IEEE, vol. 74, No. 12, pp. 1703-1714, (Dec. 1986).
Austrian Search Report for EX64/2005 dated May 4, 2005.
Austrian Search Report for EX72/2005 dated May 13, 2005.
Austrian Search Report for EX81/2005 dated May 18, 2005.
Austrian Search Report for EX170/2005 dated Jul. 6, 2005.
Austrian Search Report for EX139/2005 dated Jul. 27, 2005.
Austrian Search Report for EX144/2005 dated Aug. 11, 2005.
Austrian Search Report dated Aug. 12, 2005.
Bains, "Digital Paper Display Technology Holds Promise For Portables," CommsDesign EE Times (2000).
Bass, Handbook of Optics, vol. 1, Fundamentals, Techniques, and Design, Second Edition, McGraw-Hill, inc. New York pp. 2.29/2.36 (1995).
Chu, et al. "Formation and Microstructures of Anodic Aluminoa Films from Aluminum Sputtered onglass Substrate" Journal of the Electrochemical Society, 149 (7) B321-B327 (2002).
Conner, "Hybrid Color Display Using Optical Interference Filter Array," SID Digest, pp. 577-580 (1993).
Crouse, "Self-ordered pore structure of anodized aluminum on silicon and pattern transfer" Applied Physics Letters, vol. 76, No. 1, Jan. 3, 2000. pp. 49-51.
EP 05255661.0 European Search Report (Dec. 30, 2005).
Fan et al., "Channel Drop Filters in Photonic Crystals," Optics Express, vol. 3, No. 1 (1998).
French, P.J. "Development of Surface Micromachining techniques compatable with on-chip electronics" Journal of Micromechanics and Microengineering vol. 6 No. 2 , 197-211 XP 002360789 Jun. 1996 IOP Publishing.
Furneaux, et al. "The Formation of Controlled-porosity membranes from Anodically Oxidized Aluminium" Nature vo 337 Jan. 12, 1989, pp. 147-149.
Giles et al., "A Silicon MEMS Optical Switch Attenuator and Its Use in Lightwave Subsystems," IEEE Journal of Selected Topics in Quanum Electronics, vol. 5, No. 1, pp. 18-25, (Jan./Feb. 1999).
Goossen et al., "Possible Display Applications of the Silicon Mechanical Anti-Reflection Switch," Society for Information Display (1994).
Goossen et al., "Silicon Modulator Based on Mechanically-Active Anti-Reflection Layer with 1Mbit/sec Capability for Fiber-in-the-Loop Applications," IEEE Photonics Technology Letters, pp. 1119, 1121 (Sep. 1994).
Goossen K.W., "MEMS-Based Variable Optical Interference Devices", Optical MEMS, 2000 IEEE/Leos International Conference on Aug. 21-24, 2000, Piscataway, NJ, USA, IEE, Aug. 21, 2000, pp. 17-18.
Gosch, "West Germany Grabs the Lead in X-Ray Lithography," Electronics pp. 78-80 (Feb. 5, 1987).
Harnett et al., "Heat-depolymerizable polycarbonates as electron beam patternable sacrificial layers for nanofluidics," J. Vac. Sci. Technol. B 19(6), (Nov./Dec. 2001), pp. 2842-2845.
Howard et al., "Nanometer-Scale Fabrication Techniques," VLSI Electronics: Microstructure Science, vol. 5, pp. 145-153 and pp. 166-173 (1982).
Ibbotson et al., "Comparison of XeF2 and F-atom reactions with Si and SiO2," Applied Physics Letters, vol. 44, No. 12, pp. 1129-1131 (Jun. 1984).
Jackson "Classical Electrodynamics," John Wiley & Sons, Inc., pp. 568-573. (date unknown).
Jerman et al., "A Miniature Fabry-Perot Interferometer with a Corrugated Silicon Diaphragm Support," (1988).
Jerman J. H. et al., "Maniature Fabry-Perot Interferometers Micromachined in Silicon for use in Optical Fiber WDM Systems," Transducers. San Francisco, Jun. 24-27, 1991, Proceedings of the International Conference on Solid State Sensors Andactuators, New Youk IEEE, US, vol. Conf. 6, Jun. 24, 1991.
Joannopoulos et al., "Photonic Crystals: Molding the Flow of Light," Princeton University Press (1995).
Johnson, "Optical Scanners," Microwave Scanning Antennas, vol. 1, p. 251-261, (1964).
Kim et al., "Control of Optical Transmission Through Metals Perforated With Subwavelength Hole Arrays," Optic Letters, vol. 24, No. 4, pp. 256-257, (Feb. 1999).
Lee et al., "Electrostatic Actuation of Surface/Bulk Micromachined Single-Crystal Silicon Microresonators", International Conference on Intelligent Robots and Systems, vol. 2, pp. 1057-1062, (Oct. 17-21, 1999).
Lee et al., "The Surface/Bulk Micromachining (SBM) Process: A New Method for Fabricating Released MEMS in Single Crystal Silicon", Journal of Microelectromechanical Systems, vol. 8, Issue 4, pp. 409-416, (Dec. 1999).
Lieberman, "MEMS Display Looks to Give PDAs Sharper Image," EE Times (Feb. 11, 1997).
Lieberman, "Microbridges at Heart of New MEMS Displays," EE Times (Apr. 24, 1997).
Light over Matter, Circle No. 36 (Jun. 1993).
Lin et al., "Free-Space Micromachined Optical Switches for Optical Networking," IEEE Journal of Selected Topics in Quantum Electronics, vol. 5, No. 1, pp. 4-9. (Jan./Feb. 1999).
Little et al., "Vertically Coupled Microring Resonator Channel Dropping Filter," IEEE Photonics Technology Letters, vol. 11, No. 2, (1999).
Magel, "Integrated Optic Devices Using Micromachined Metal Membranes," SPIE vol. 2686, 0-8194-2060-Mar. (1996).
Maboudian, et al. Critical Review: Adhesion in Surface Micromechanical Structures: J. Vac. Sci Techno. B 15(1) Jan./Feb. 1997, pp. 1-20.
Microchem, LOR Lift-Off Resists Datasheet, 2002.
Miles, "Interferometric Modulation: MOEMS as an Enabling Technology for High-Performance Reflective Displays," Proceedings of the International Society for Optical Engineering, San Jose, CA, vol. 49085, pp. 131-139 (Jan. 28, 2003).
Miles, et al., "10.1: Digital Paper for Reflective Displays," 2002 SID International Symposium Digest of Technical Papers, Boston, MA, SID International Symposium Digest of Technical Papers, San Jose, CA, vol. 33/1, pp. 115-117 (May 21-23, 2002).
Miles, Mark, W., "A New Reflective FPD Technology Using Interferometric Modulation," The Proceedings of the Society for Information Display (May 11-16, 1997).
Nagami et al., "Plastic Cell Architecture: Towards Reconfigurable Computing For General-Purpose," IEEE, 0-8186-8900-, pp. 68-77, (May 1998).
Newsbreaks, "Quantum-trench devices might operate at terahertz frequencies," Laser Focus World (May 1993).

Oliner et al., "Radiating Elements and Mutual Coupling," Microwave Scanning Antennas, vol. 2, pp. 131-141, (1966).

Penta Vacuum MEMS Etcher Specifications, http://www.pentavacuum.com/memes.htm, Jan. 5, 2005.

Raley et al., "A Fabry-Perot Microinterferometer for Visible Wavelengths," IEEE Solid-State Sensor and Actuator Workshop, Jun. 1992, Hilton Head, SC.

Schnakenberg, et al. TMAHW Etchants for Silicon Micromachining. 1991 International Conference on Solid State Sensors and Actuators-Digest of Technical Papers. pp. 815-818.

Science and Technology, The Economist, pp. 89-90, (May 1999).

Search Report PCT/US02/13442 (Sep. 13, 2002).

Search Report PCT/US04/20330 (Nov. 8, 2004).

Search Report PCT/US05/031237.

Search Report PCT/US05/030033 and Written Opinion.

Search Report PCT/US05/030902 And Written Opinion.

Search Report and Written Opinion for PCT/US05/33558 (May 19, 2005).

Search Report PCT/US05/032331 (Jan. 9, 2006).

Search Report PCT/US05/032331 (Apr. 7, 2006).

Search Report and Written Opinion for PCT/US05/032647.

PCT/US05/029821 International Search Report (Dec. 27, 2005).

PCT/US05/030927 International Search Report (Jan. 25, 2006).

PCT/US05/031693 Internatioanl Search Report.

PCT/US05/033558 Partial International Search Report (Feb. 24, 2006).

PCT/US2004/035820 International Search Report and Written Opinion (Apr. 11, 2005).

PCT/US96/17731 Search Report.

Sperger et al., "High Performance Patterned All-Dielectric Interference Colour Filter for Display Applications," SID Digest, pp. 81-83, (1994).

Sridharan et al., "Post-Packaging Release a New Concept for Surface-Micromachined Devices" Technical Digest, IEEE Solid-State Sensor & Actuator Workshop, New York, NY, US, Nov. 8, 1998, pp. 225-228, XP000992464.

Stone, "Radiation and Optics, An Introduction to the Classical Theory," McGraw-Hill, pp. 340-343, (1963).

Tayebi et al. "Reducing the Effects of adhesion and friction in microelectomechanical sysmem (MEMS) through surface roughening: Comparison Between theory and experiments" http://jap.ajp.org/jap/copyright.isp Journal of applied Physics 98, 073528 (2005).

Thin Film Transistors- Materials and Processes -vol. 1 Amorphous Silicon Thin Film Transistors ed. Yue Kuo, Kluwer Academic Publishers, Boston (2004).

Walker et al., "Electron-beam-tunable Interference Filter Spatial Light Modulator," Optics Letters vol. 13, No. 5, pp. 345-347, (May 1988).

Williams et al., "Etch Rates for Micromachining Processing," Journal of Microelectromechanical Systems, vol. 5, No. 4, pp. 256-259 (Dec. 1996).

Winters et al., "The etching of silicon with XeF2 vapor. Applied Physics Letters," vol. 34, No. 1, pp. 70-73 (Jan. 1979).

Winton, "A novel way to capture solar energy," Chemical Week, (May 1985).

Wu, "Design of a Reflective Color LCD Using Optical Interference Reflectors," ASIA Display '95, pp. 929-931, (Oct. 1995).

Zhou et al., "Waveguide Panel Display Using Electromechanical Spatial Modulators" SID Digest, vol. XXIX, (1998).

Xactix Xetch X3™ Specifications, http://www.xactix.com/Xetch_X3specs.htm, Jan. 5, 2005.

Xactix Xetch™ Product Information.

Kawamura et al., Fabrication of fine metal microstructures packaged in the bonded glass substrates, Proceedings of SPIE, vol. 3893, pp. 486-493, 1999.

Hall, Integrated optical inteferometric detection method for micromachined capacitiive acoustic transducers, App. Phy. Let. 80:20(3859-3961) May 20, 2002.

Matsumoto et al., Novel prevention method of stiction using silicon anodization for SOI structure, Sensors and Actuators, 72:2(153-159) Jan. 19, 1999.

Watanabe et al., Reduction of microtrenching and island formation in oxide plasma etching by employing electron beam charge neutralization, Applied Physics Letters, 79:17(2698-2700), Oct. 22, 2001.

Dai et al., "A CMOS surface micromachined pressure sensor," Journal of the Chinese institute of Engineers, 1999, vol. 22, No. 3 (May), pp. 375-380.

Ma et al., "A novel integrated multistage optical MEMS-mirror switch architecture design with shuffle Benes inter-stage connecting principle," Optics Communications 242 (2004), pp. 179-189.

Dai et al., "A maskless post-CMOS bulk micromachining process and its application," Journal of Micromechanics and Microengineering, vol. 15, No. 12, pp. 2366-2371, IOP Publishing, Dec. 2005.

DeHon, Array-based architecture for FET-based, nanoscale electronics, IEEE Transactions on Nanotechnology, 2(1):23-32 Mar. 2003.

* cited by examiner

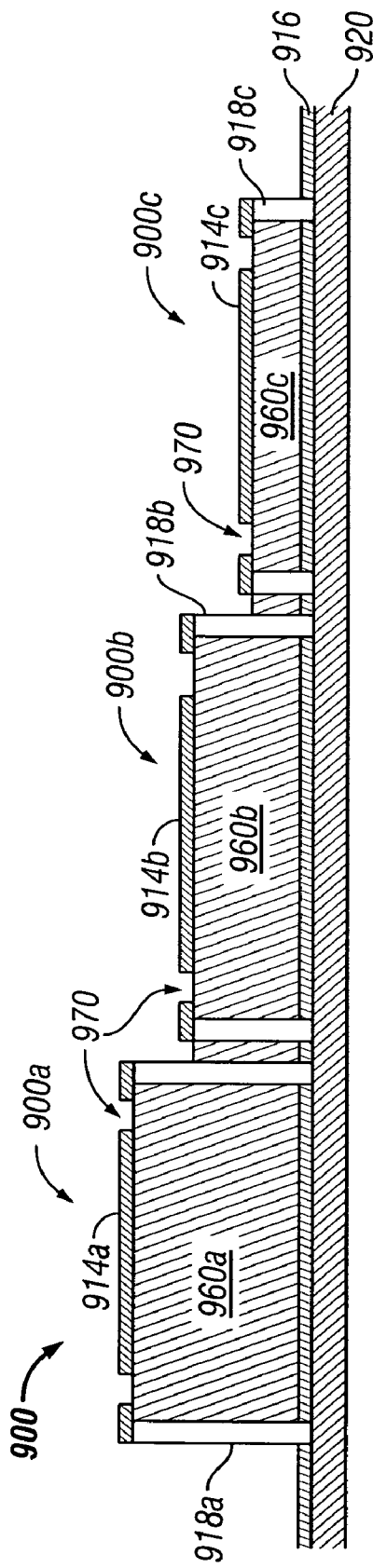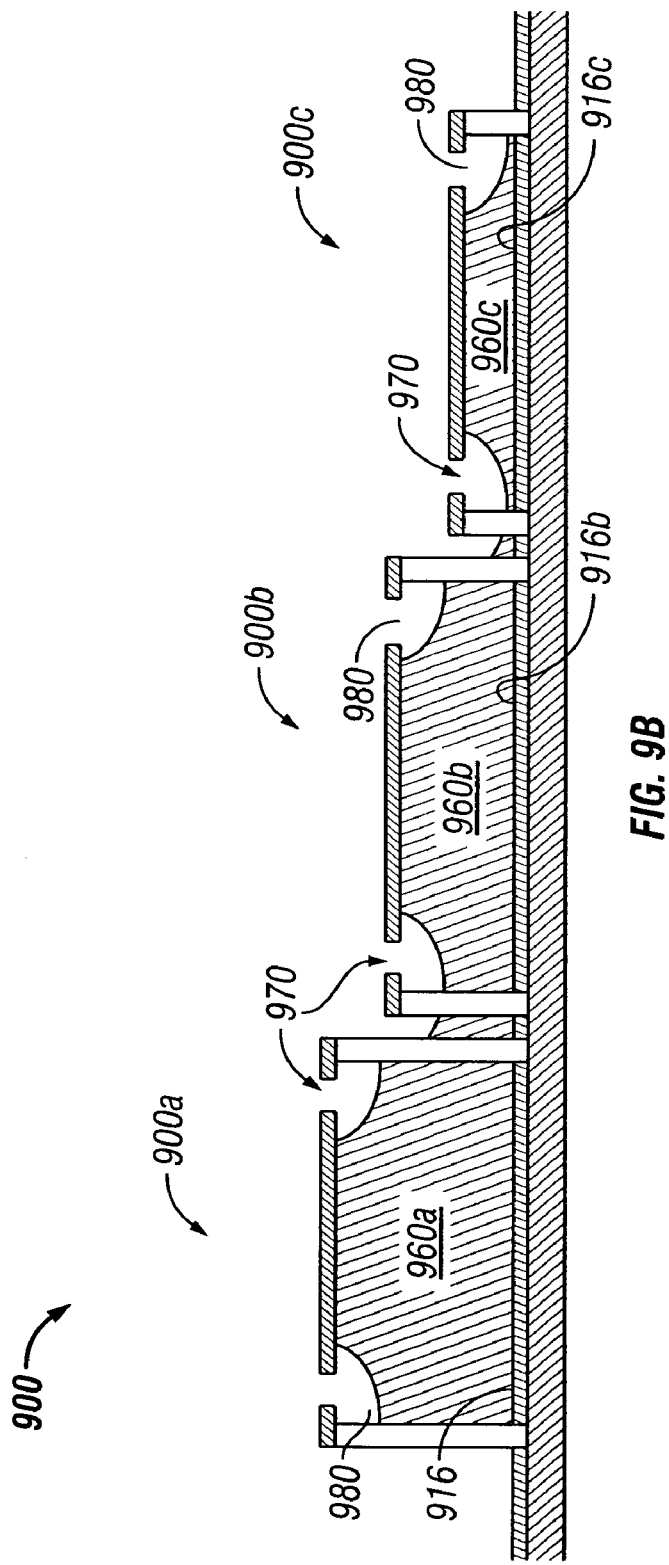
FIG. 9A
FIG. 9B

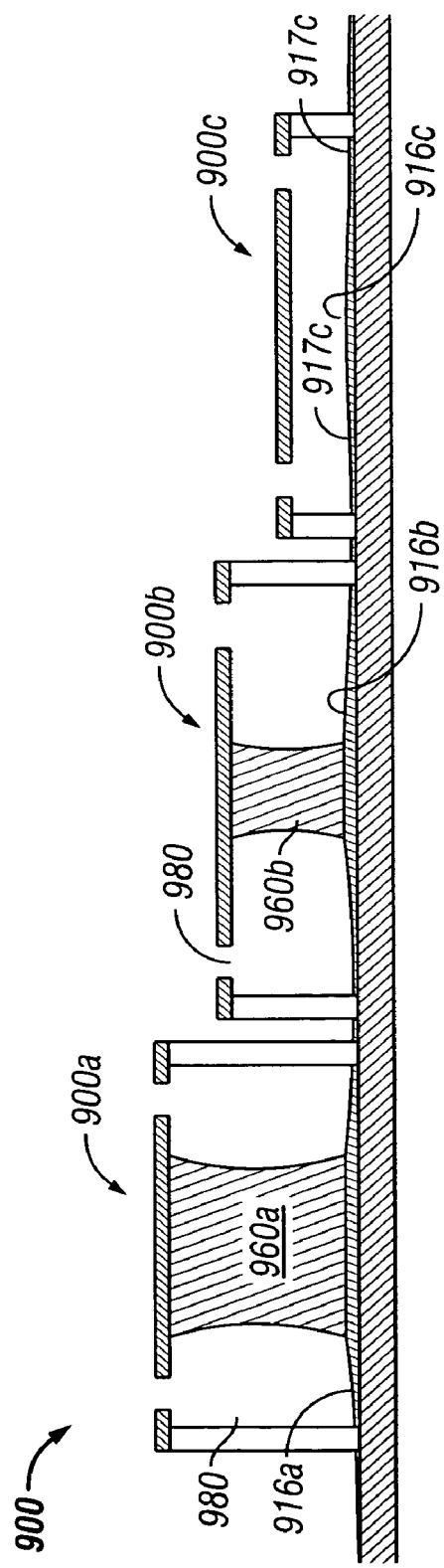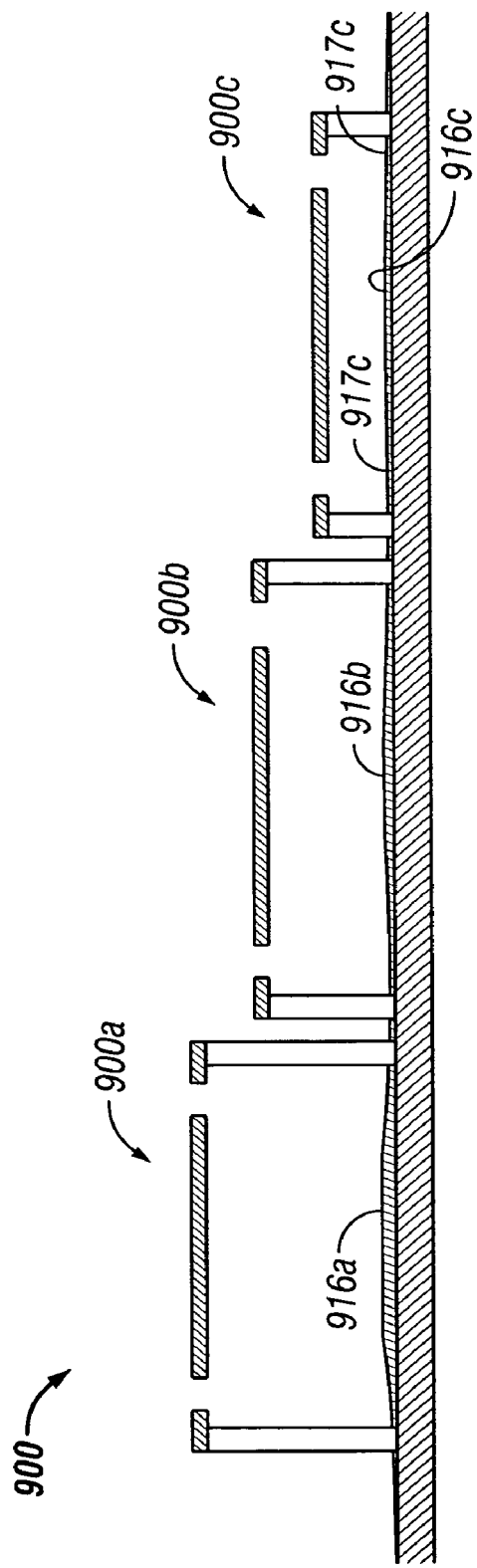

SELECTIVE ETCHING OF MEMS USING GASEOUS HALIDES AND REACTIVE CO-ETCHANTS

BACKGROUND OF THE INVENTION

1. Field of the Invention

This application is generally related to microelectromechanical systems, and more particularly, to interferometric modulators.

2. Description of the Related Art

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

Some embodiments provide a method for fabricating a microelectromechanical systems device comprising: contacting a microelectromechanical systems device with a vapor phase etchant comprising a gaseous halide and a co-etchant, wherein the microelectromechanical systems device comprises a target material and a structural material; the target material and the structural material are both etchable by the gaseous halide with an etching selectivity between the target material and the structural material of at least about 50:1 in the absence of a co-etchant; and the co-etchant is present in an amount effective to improve the etching selectivity between the target material and the structural material by at least about 2-times compared with the etching selectivity in the absence of the co-etchant.

Some embodiments provide a microelectromechanical (MEMS) device fabricated by a method comprising: contacting a microelectromechanical systems device with a vapor phase etchant comprising a gaseous halide and a co-etchant, wherein the microelectromechanical systems device comprises a target material and a structural material; the target material and the structural material are both etchable by the gaseous halide with an etching selectivity between the target material and the structural material of at least about 50:1 in the absence of a co-etchant; and the co-etchant is present in an amount effective to improve the etching selectivity between the target material and the structural material by at least about 2-times compared with the etching selectivity in the absence of the co-etchant.

In some embodiments, the microelectromechanical systems device comprises an interferometric modulator, wherein at least a portion of the target material is a sacrificial material that after etching defines a cavity, and at least a portion of the structural material is a dielectric material disposed on a stationary electrode.

Some embodiments provide a method for fabricating a microelectromechanical systems device comprising: contacting a microelectromechanical systems device with a vapor phase etchant means and a co-etchant means, wherein the microelectromechanical systems device comprises a metal target material and a structural material; and the co-etchant means is present in an amount effective to improve an etching selectivity between the target material and the structural material by at least 2-times compared with an etching selectivity between the target material and the structural material in the absence of the co-etchant means.

Some embodiments provide a method for fabricating an interferometric modulator comprising: contacting an unreleased interferometric modulator with a vapor phase etchant and a vapor phase co-etchant, wherein the unreleased interferometric modulator comprises a sacrificial material in contact with a dielectric material, and at least a portion of the sacrificial material when etched away forms a cavity; and etching away substantially all of the at least a portion of the sacrificial material, wherein the co-etchant is present in an amount sufficient to improve the etching selectivity between the sacrificial material and the dielectric material by at least 2-times.

In some embodiments, the etching away substantially all of the at least a portion of the sacrificial material is performed in a single etching cycle.

In some embodiments, the gaseous halide comprises a compound selected from the group consisting of noble gas fluorides, interhalogen fluorides, interhalogen chlorides, $NF_3$, and combinations thereof. In some embodiments, the gaseous halide is $XeF_2$.

In some embodiments, the target material comprises a metal. In some embodiments, the metal is selected from the group consisting of titanium, zirconium, hafnium, vanadium, tantalum, niobium, molybdenum, tungsten, and combinations thereof. In some embodiments, the metal comprises molybdenum.

In some embodiments, the structural material comprises a dielectric material. In some embodiments, the dielectric material comprises $SiO_2$.

In some embodiments, the co-etchant comprises an oxygen-containing compound. In some embodiments, the oxygen-containing compound is selected from the group consisting of $O_2$, $O_3$, ozonides, peroxides, peracids, superoxides, $N_xO_y$, $S_xO_y$, and combinations thereof. In some embodiments, the oxygen-containing compound comprises $O_2$. In some embodiments, the co-etchant comprises a nitrogen-containing compound. In some embodiments, the nitrogen-containing compound is selected from the group consisting of amines, amides, azides, and combinations thereof. In some embodiments, the co-etchant comprises a sulfur-containing compound. In some embodiments, the co-etchant comprises a sulfur-containing compound selected from the group consisting of thiols, sulfides, thiones, thioic acids, carbon disulfide, OCS, and combinations thereof.

In some embodiments, a ratio between the co-etchant and etchant is at least about 1:1. In some embodiments, a ratio between the co-etchant and etchant is at least about 10:1.

In some embodiments, the etching selectivity between the target material and the structural material is at least about 100:1 in the absence of a co-etchant.

In some embodiments, the etching selectivity between the target material and the structural material in the presence of the co-etchant is at least 4-times the etching selectivity between the target material and the structural material in the absence of the co-etchant. In some embodiments, the etching selectivity between the target material and the structural in the presence of the co-etchant is at least 10-times the etching selectivity between the target material and the structural material in the absence of the co-etchant.

In some embodiments, a pressure of the vapor phase etchant is from about 0.5 torr to about 400 torr for at least a portion of the etching process. In some embodiments, a temperature is from about 0° C. to about 200° C. for at least a portion of the etching process.

BRIEF DESCRIPTION OF THE DRAWINGS

FIGS. 9A-9D illustrate in cross section an embodiment of a release etch of an interferometric array.

DETAILED DESCRIPTION OF THE PREFERRED EMBODIMENT

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

A method for etching a target material in the presence of a structural material with increased selectivity uses an etchant and a co-etchant. Embodiments of the method exhibit improved selectivities of from at least about 2- to at least about 100-fold compared with similar etching processes not using a co-etchant. In some embodiments, the target material comprises a metal. Embodiments of the method are particularly useful in the manufacture of MEMS devices, for example, interferometric modulators. In some embodiments, the target material comprises molybdenum and the structural material comprises silicon dioxide.

Embodiments of methods for manufacturing interferometric modulators and/or other MEMS devices use one or more release etch steps in which one or more target or sacrificial materials at least partially surrounded by one or more structural or non-sacrificial materials are etched away to form an opening or cavity in the device. Selectivity in the etching of the sacrificial material over the non-sacrificial material becomes increasing important as device dimensions shrink, for example, in maintaining physical integrity and yields, as well as in optical components in interferometric modulators. Embodiments of an etching method use an etchant and a co-etchant improves the etching selectivity between the sacrificial material and the non-sacrificial material.

Figure 1:
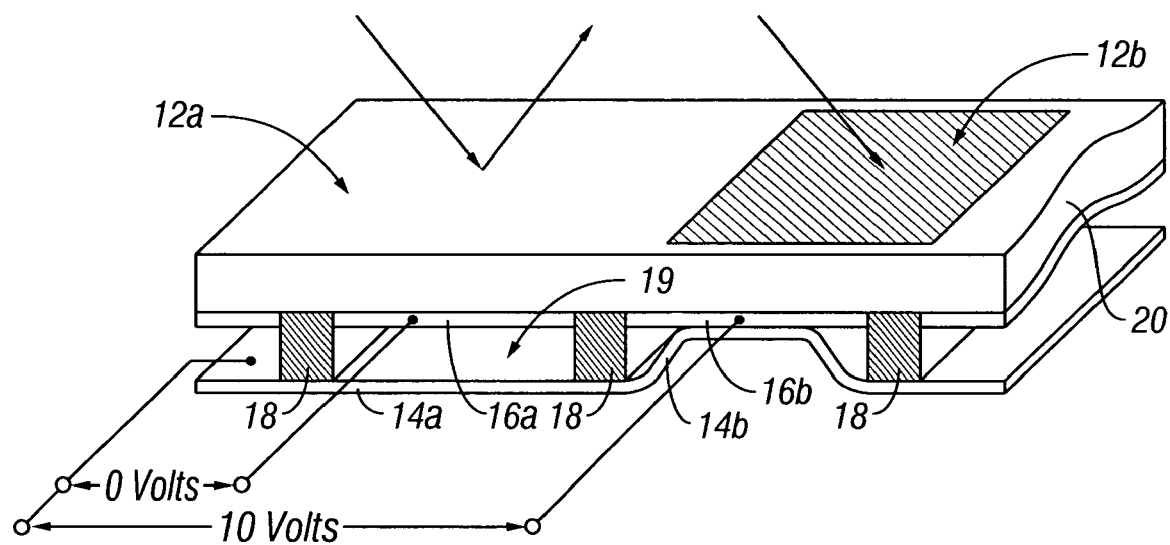
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
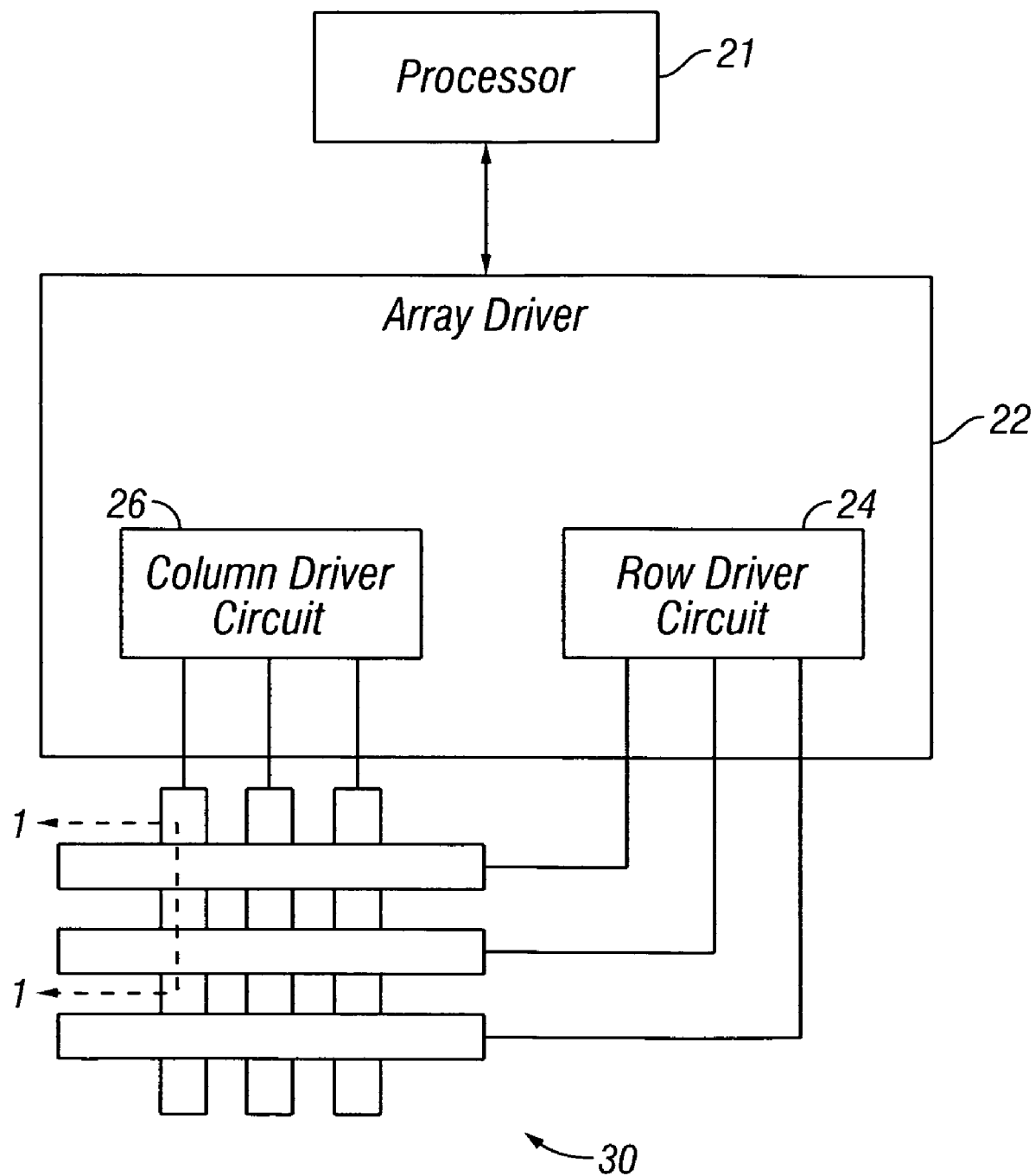
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
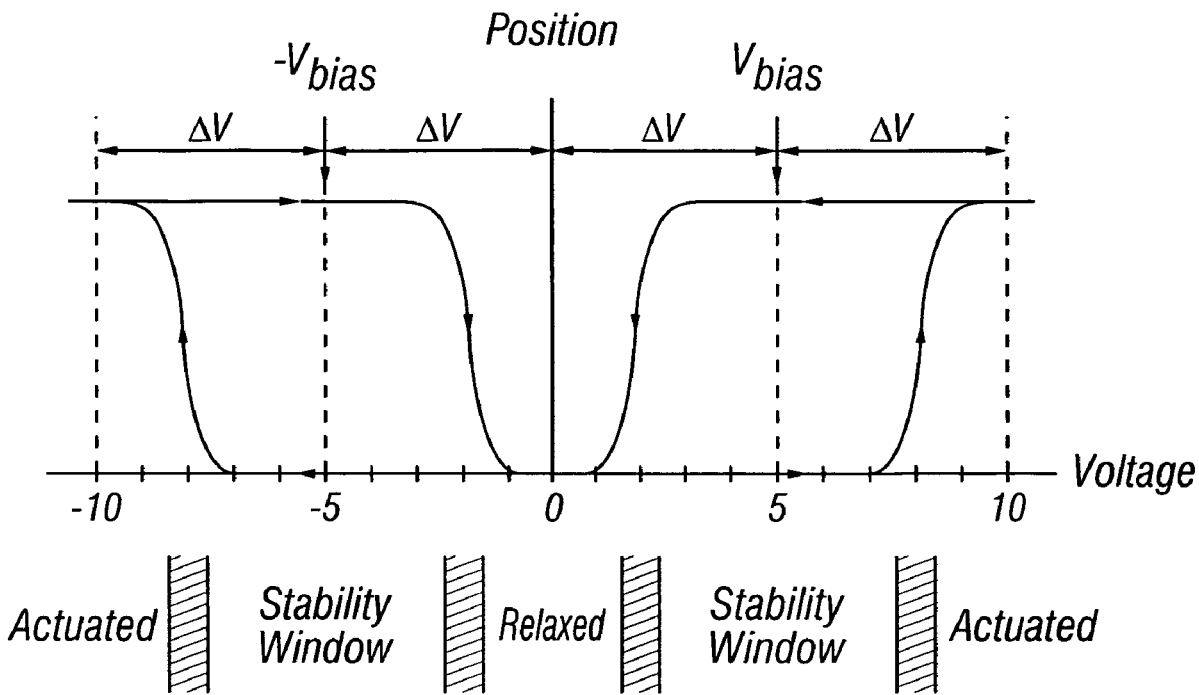
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
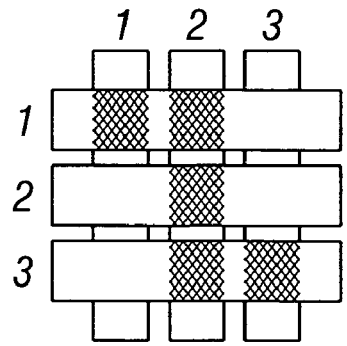
FIG. 5A illustrates one exemplary frame of display data in the 3×3 interferometric modulator display of FIG. 2.
Figure 5B:
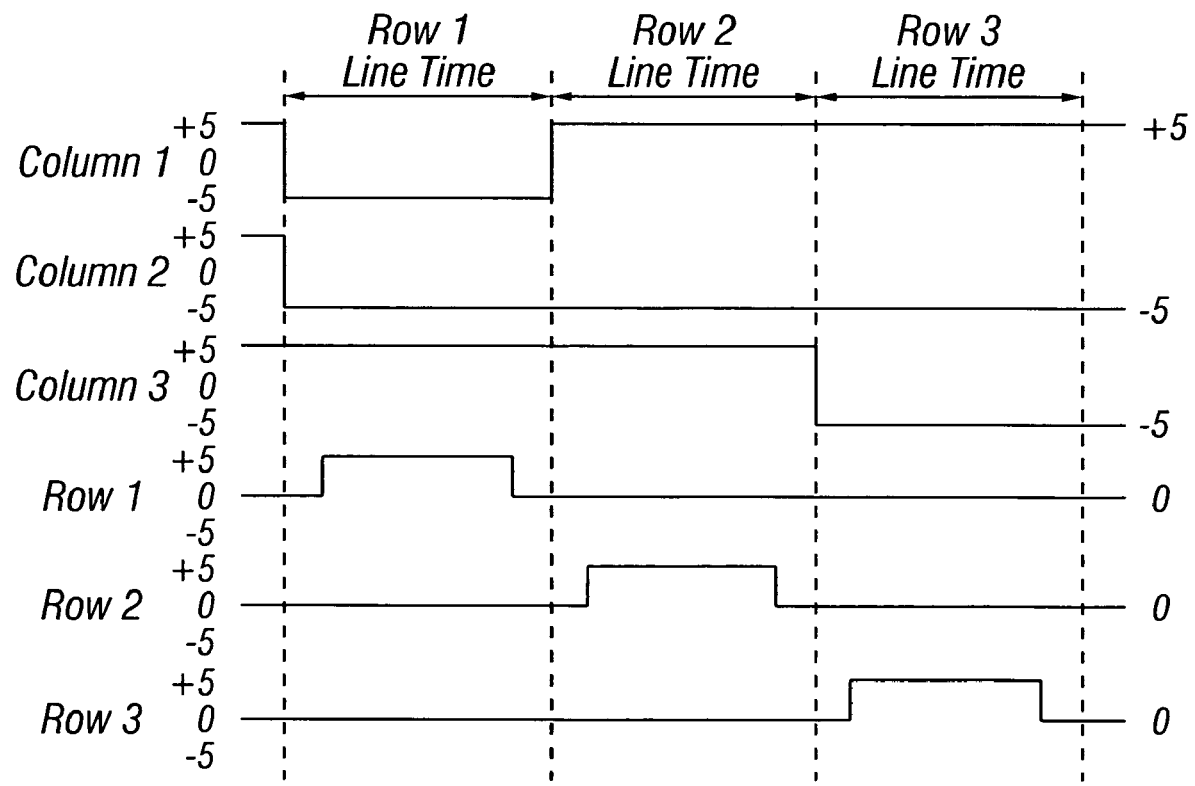
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate volts, respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
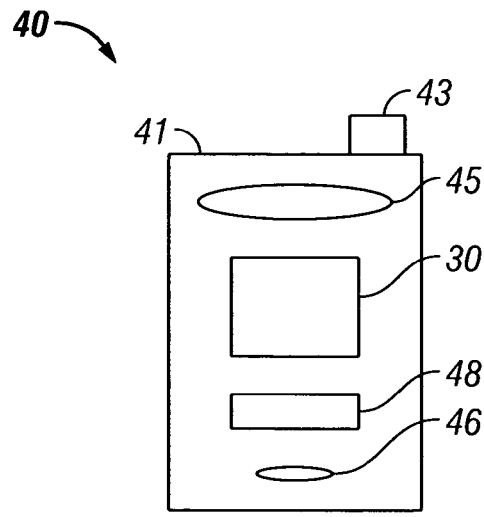
FIGS. 6A and 6B are system block diagrams illustrating an embodiment of a visual display device comprising a plurality of interferometric modulators.
Figure 6B:
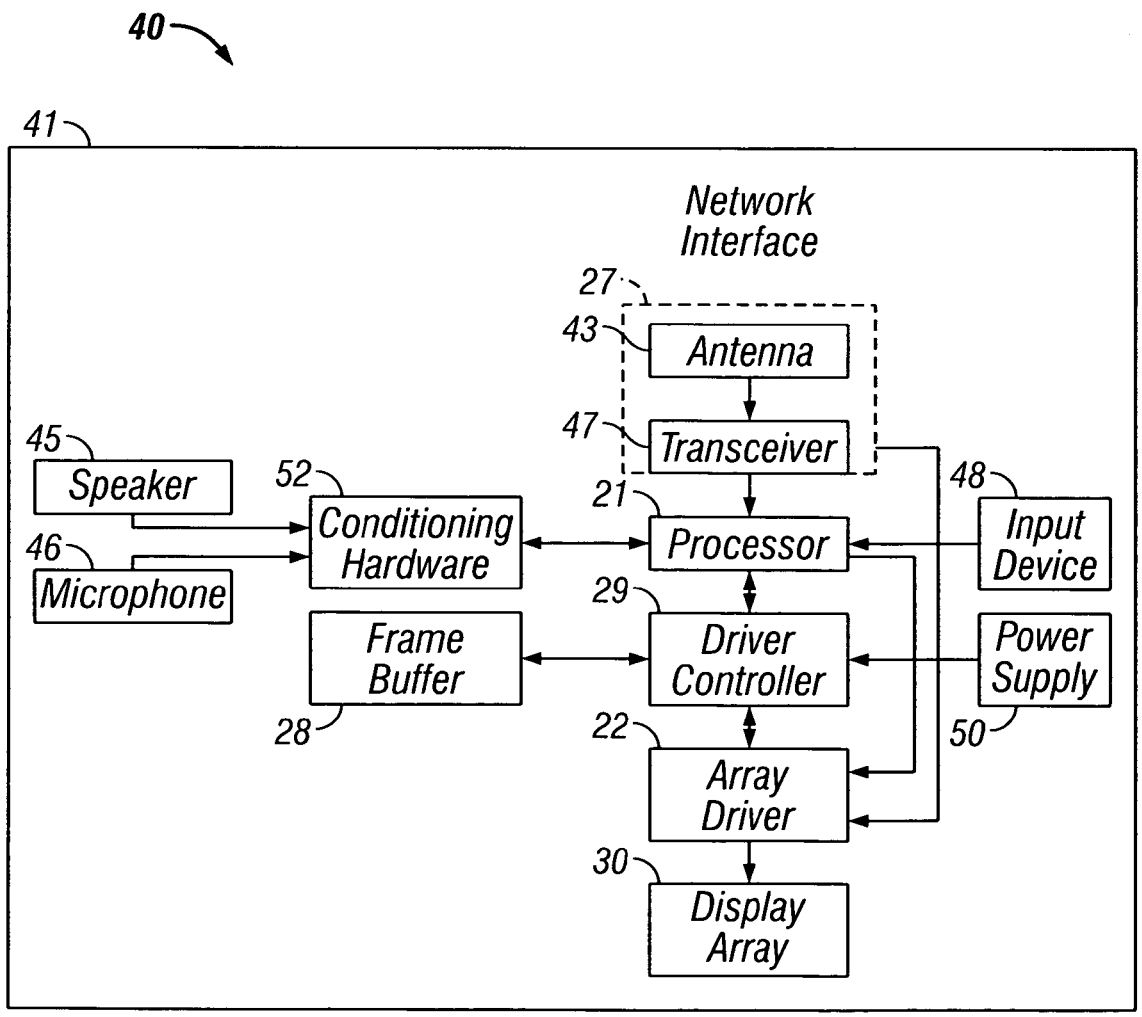

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, the network interface 27 can be replaced by an image source, which can store or generate image data to be sent to the processor 21. For example, the image source can be a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, the driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell including a plastic solar cell, and solar-cell paint. In another embodiment, the power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
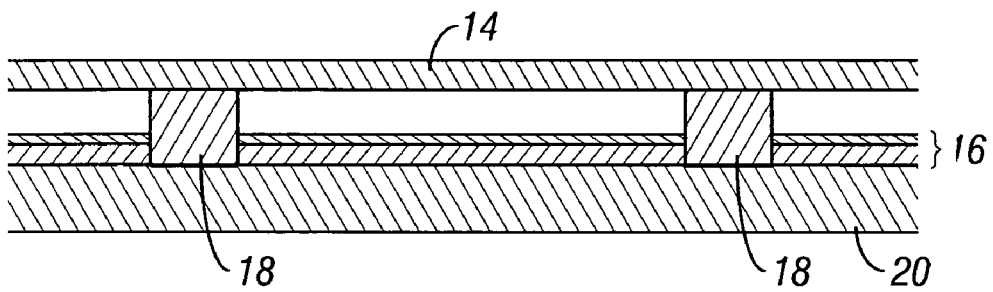
FIG. 7A is a cross section of the device of FIG. 1.
Figure 7B:
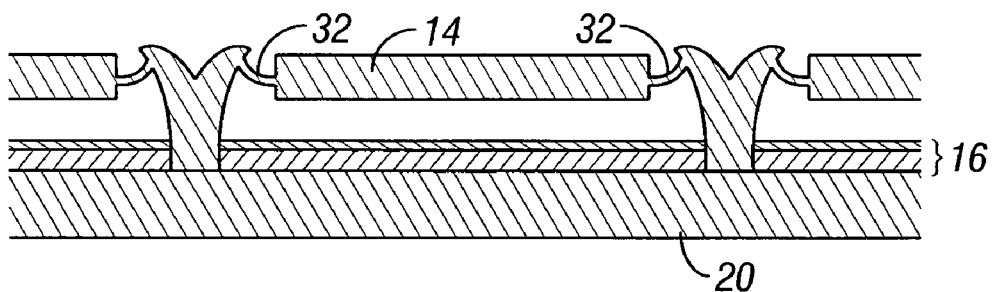
FIG. 7B is a cross section of an alternative embodiment of an interferometric modulator.
Figure 7C:
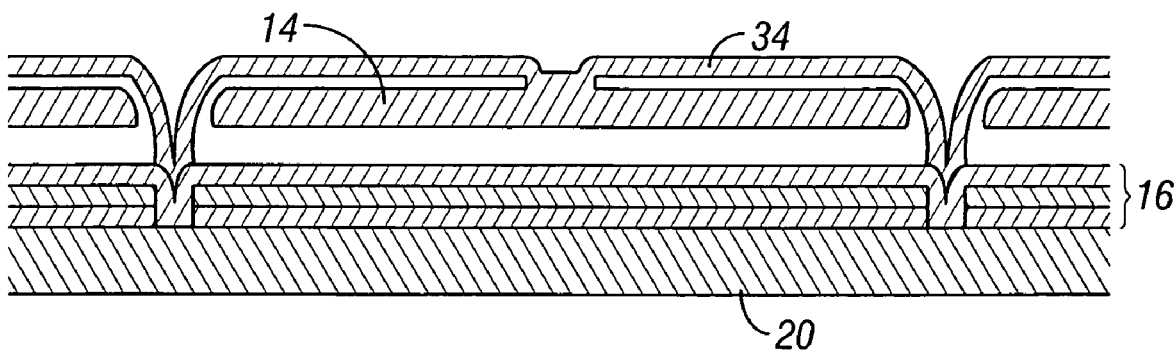
FIG. 7C is a cross section of another alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections can take the form of continuous walls and/or individual posts. For example, parallel rails can support crossing rows of deformable layer 34 materials, thus defining columns of pixels in trenches and/or cavities between the rails. Additional support posts within each cavity can serve to stiffen the deformable layer 34 and prevent sagging in the relaxed position.

Figure 7D:
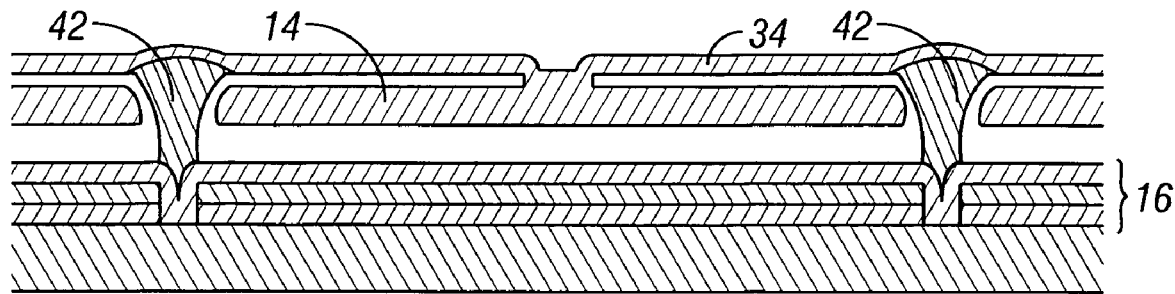
FIG. 7D is a cross section of yet another alternative embodiment of an interferometric modulator.
Figure 7E:
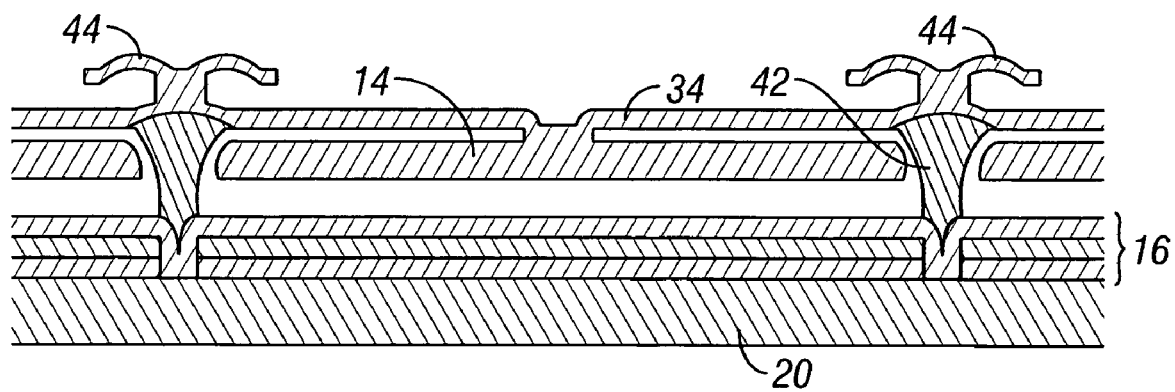
FIG. 7E is a cross section of an additional alternative embodiment of an interferometric modulator.

The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

As discussed above, some embodiments of the disclosed interferometric modulator are fabricated using methods in which portions or all of one or more sacrificial materials are substantially etched away in one or more steps of a manufacturing process, for example, as disclosed in U.S. Patent Publication No. 2004/0051929 A1. Such an etching process is also referred to herein as a "release etch." For example, in some embodiments, a device comprising a sacrificial material is contacted with an etchant that selectively etches away the sacrificial material. In some preferred embodiments, the etchant is a vapor phase etchant, for example, $XeF_2$, and substantially all of the etching products are also in the vapor phase. In some preferred embodiments, the sacrificial material is selectively etched over other, non-sacrificial materials that contact the etchant.

As used herein, a material for which etching is desired in a particular etching step is also referred to herein as a "target material." A material for which etching is not desired in a particular etching step is also referred to herein as a "structural material," although those skilled in the art will understand that a structural material does not necessarily have a structural function in the final device. Those skilled in the art will understand that a structural material in one step can be a target material in another step. For example, in some embodiments, a sacrificial material is a structural material in one or more steps and a target material in another step. Accordingly, those skilled in the art will understand that the etching conditions in a particular step will determine whether a material is a target material or a structural material.

FIGS. 8A-8E illustrate in cross section devices 800 used in some embodiments of a method for fabricating the devices illustrated in FIGS. 7A-7E. Each of these devices 800 comprises a sacrificial material 860 disposed in a volume that is a cavity in the corresponding devices illustrated in FIGS. 7A-7E. The devices illustrated in FIGS. 8A-8E are also referred to herein as "unreleased," and the devices illustrated in FIGS. 7A-7E are referred to as "released." Accordingly, a process from etching away the sacrificial material 860 is referred to herein as a "release etch." These device also comprise one or more etch holes (not illustrated) formed, for example, in the deformable layer 34 through which an etchant accesses the sacrificial material 860 in a release etch process. In the illustrated embodiments, the etchant also accesses the sacrificial material 860 from open sides of the interferometric modulator arrays. In some embodiments, contacting the devices 800 illustrated in any of FIGS. 8A-8E to a vapor phase etchant, for example, $XeF_2$, provides the devices illustrated in FIGS. 7A-7E. Those skilled in the art will understand that some embodiments of the sacrificial material 860 comprise one or more layers. In some embodiments, the sacrificial material 860 comprises a material etchable by $XeF_2$, for example, silicon, titanium, zirconium, hafnium, vanadium, tantalum, niobium, molybdenum, tungsten, and combinations thereof.

Figure 8A:
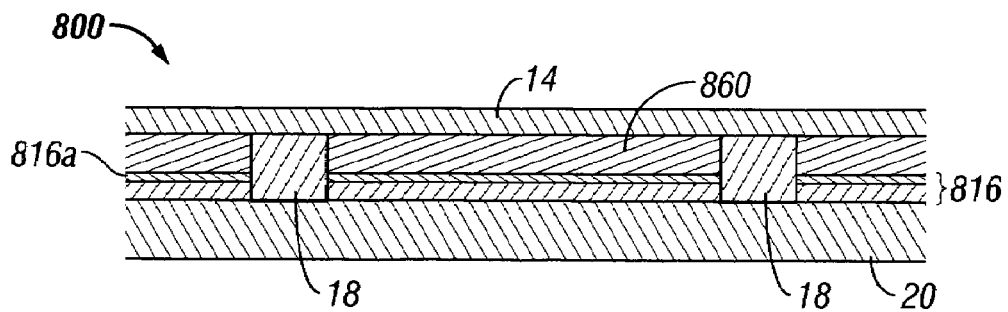
FIGS. 8A-8E illustrate in cross section embodiments of unreleased interferometric modulators corresponding to the devices illustrated in FIGS. 7A-7E prior to etching away a sacrificial material in a release etch.
Figure 8B:
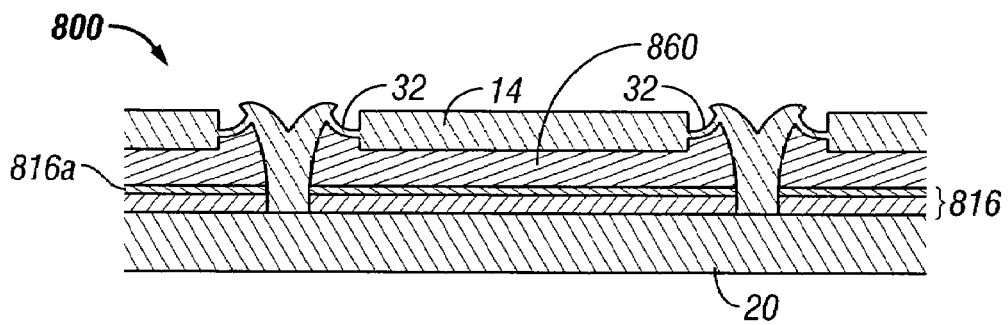
Figure 8C:
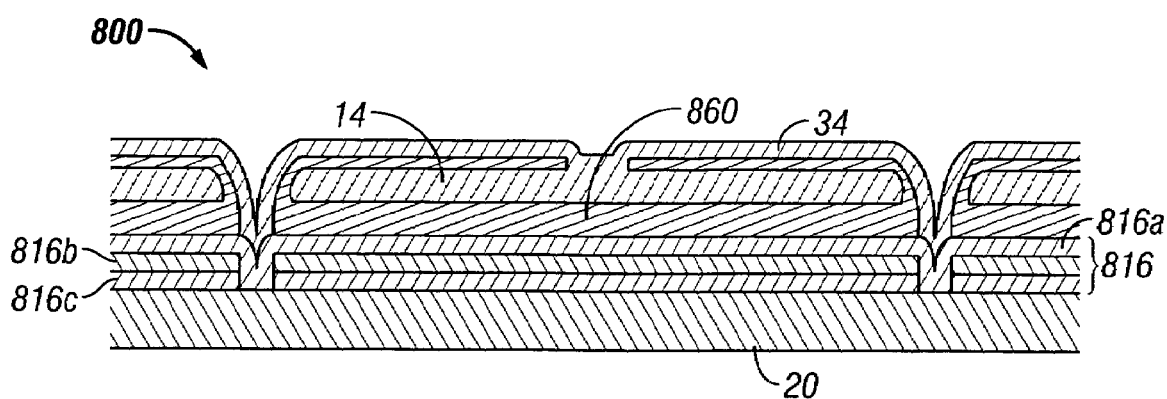
Figure 8D:
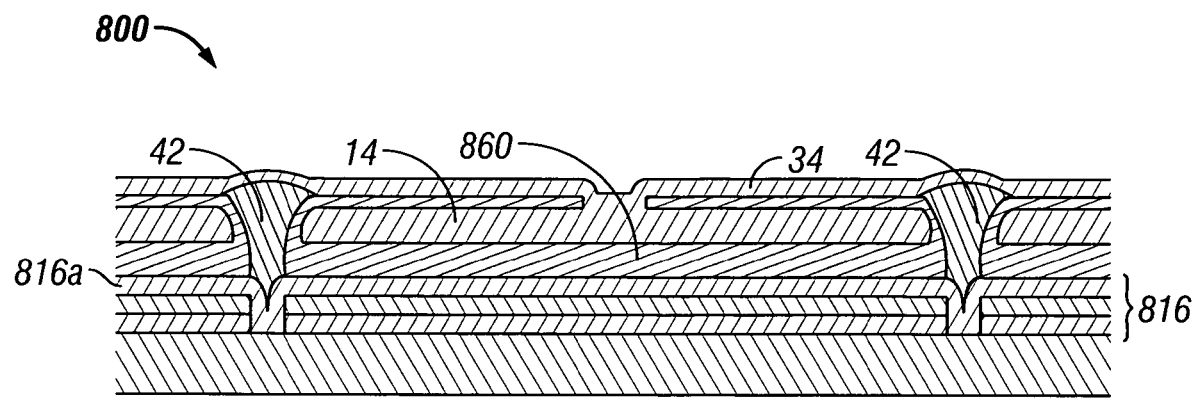
Figure 8E:
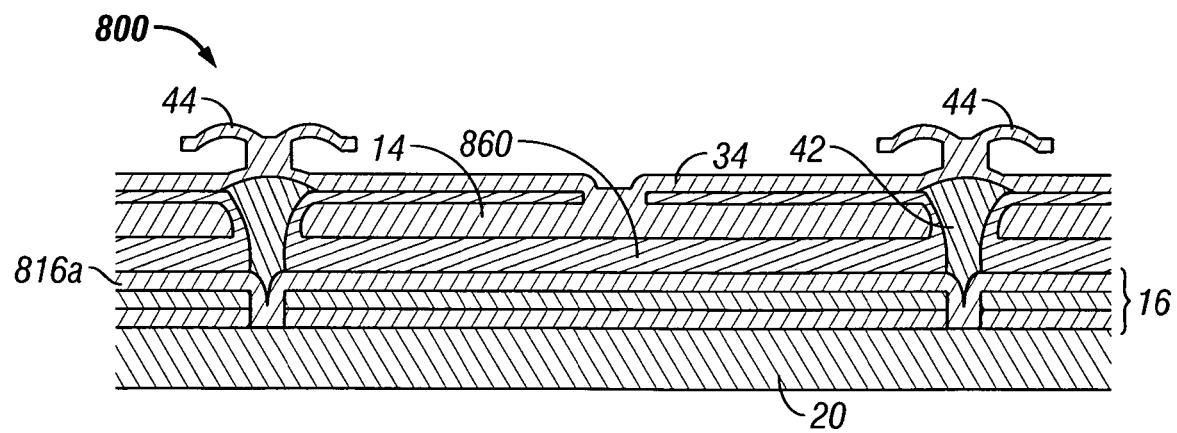

As discussed above, the optical stack 816 in some embodiments of the disclosed interferometric modulators comprise a dielectric layer 816a formed over a partially reflective layer 816b and a conductive layer 816c, for example, as illustrated in FIG. 8C. In some embodiments, the dielectric layer 816a comprises silicon dioxide. In some embodiments for manufacturing an interferometric modulator, etching away a molybdenum sacrificial layer 860 with a thickness of from about 0.15 µm to about 0.7 µm using $XeF_2$, the silicon dioxide dielectric layer 816a was also etched to a depth of up to about 500 Å, which is significant in a dielectric layer with an original thickness of about 1000 Å. In other words, the etching is not as selective as desired for preferentially etching molybdenum over silicon dioxide.

Improving selectivity in etching processes becomes increasingly important as feature dimensions shrink. In particular, in the fabrication of MEMS devices, sacrificial materials are often disposed under and/or between one or more non-sacrificial materials with structural, electrical, and/or optical functions. Undesired etching of the structural and/or optical components can result in failure of the device and/or changes in the physical and/or optical properties of the device, for example, changes in the color of a pixel. In some embodiments, undesired etching is particularly acute at or around openings in a device that provide etchant access to the sacrificial material. In some embodiments, the observed etching selectivity between a target material and a structural material in a confined volume is different from the selectivity of the same materials in an unconfined configuration. The confined volume results in extended contact between the target and structural materials with, for example, excess etchant, etching byproducts, and/or etching intermediates. As discussed in greater detail below, it is believed that certain etching byproducts and/or etching intermediates are effective etchants for the target material and/or the structural material. Because the etching selectivities of these compounds are different from the etching selectivity of the etchant, the observed or effective etching selectivity depends on the relative concentrations of all of the active etching species. In particular, in a volume with reduced diffusion, the relative concentrations of the etchant, etching byproducts, and/or reactive etching intermediates change over the course of the etching process. As a consequence, the effective etching selectivity also changes during the etching process. As a result, in some embodiments, an etching process in a confined volume exhibits a lower effective selectivity than would be otherwise expected based on known and/or measured etching rates of the respective bulk materials.

Selectivity is particularly important, for example, in embodiments comprising a plurality of sacrificial layers with different thickness because some of the sacrificial layers will be etched away faster than others, thereby exposing some of the underlying non-sacrificial materials to the etchant for a longer time. For example, FIG. 9A illustrates a cross section of an unreleased interferometric modulator array 900 comprising a red interferometric modulator 900a, a green interferometric modulator 900b, and a blue interferometric modulator 900c similar to the unreleased interferometric modulator illustrated in FIG. 8A. Those skilled in the art will understand that similar considerations also apply to the release etch of MEMS devices of other designs, for example, those illustrated in FIGS. 8B-8E. An optical stack 916 comprising a dielectric layer is formed on a glass substrate 920. A plurality of supports, collectively 918, extends upwards from the substrate 920. As noted above, such supports 918 can comprise continuous walls, rails, and/or individual posts. FIGS. 9A-9D illustrate supports 918 corresponding to each of the interferometric modulators 900a, 900b, and 900c. The red interferometric modulator 900a comprises supports 918a, the green interferometric modulator 900b comprises supports 918b, and the blue interferometric modulator 900c comprises supports 918c. In the illustrated embodiment, supports 918c are longer than supports 918b, which are in turn, longer than supports 918a. Deformable layers 914a, 914b, and 914c corresponding to interferometric modulators 900a, 900b, and 900c are formed over the supports 918a, 918b, and 918c, respectively. Disposed between the optical stack 916 and each of the deformable layers 914a, 914b, and 914c is a layer of sacrificial material 960a, 960b, and 960c. Note that the array 900 is not drawn to scale. In some embodiments, the thickness of the layers of sacrificial material 960a, 960b, and 960c are on the order of tenths of microns, while the overall widths of the interferometric modulators 900a, 900b, and 900c are on the order of tens of microns. Accordingly, certain features in FIGS. 9A-9D are exaggerated for clarity.

FIG. 9B illustrates the initial etching of the sacrificial layers 960a, 960b, and 960c through the etch holes 970, forming cavities 980. In the illustrated embodiments, the etchant accesses the sacrificial layers 960 exclusively through the etching holes 970. As discussed above, some embodiments of unreleased interferometric modulators permit etchant access through, for example, one or more of the sides of the device. In the case of the blue interferometric modulator 900c, the cavity 980 extends to the optical stack 916 exposing a portion 916c to the etchant, etching byproducts, and etching intermediates. No portions of the optical stack 916 have yet been exposed in the green or blue interferometric modulators 900b and 900a. The portion of the optical stack 916c is therefore susceptible to etching at the stage illustrated in FIG. 9B. Subsequent etching of the sacrificial layer 960c in the blue interferometric modulator 900c proceeds generally horizontally.

All other things being equal, in releasing the array 900, the thinner sacrificial layer 960c of blue interferometric modulator 900c will be completely etched away before sacrificial layers 960b (green) and 960a (red), as illustrated in FIG. 9C. At this stage, the portion 916c of the optical stack of the blue interferometric modulator 900c is completely exposed to the etchant, while portions of the optical stack 916b and 916a of the green 900b and red 900a interferometric modulators are partially exposed. In the illustrated embodiment, etching holes 970 are formed in the deformable layers 914a, 914b, and 914c. Accordingly, etchant accesses the sacrificial layers 916a, 916b, and 916c through an etching hole 970, forming a cavity 980 generally centered on the etching hole 970. As discussed above, the etch holes 970 limit diffusion of fresh etchant into, and etching byproducts and intermediates out of the cavity 980. Portions of the dielectric layer 916 exposed by the cavity 980 experience increased etching by the etchant and/or etching by-products compared with unexposed portions, thereby forming dips 917a, as best seen for the optical stack portion 916c.

The etching is complete when the sacrificial layers 960b and 960a of the green and red interferometric modulator 900b and 900a are etched away, thereby completely exposing the portions of the optical stack 916b and 916a to the etchant, as illustrated in FIG. 9D. At this stage, the optical stack 916c is further etched relative to the state illustrated in FIG. 9C.

In some embodiments, etching selectivity is expressed as a ratio between an etching rate of a target material and an etching rate of a structural material. The etching rate for a particular material will differ depending on factors known in the art, for example, the identity of the etchant, etchant concentration, temperature, and the like. In the fabrication of MEMS devices comprising openings, cavities, and the like, one factor affecting etch rate is mass transport, which affects, for example, the rate at which fresh etchant diffuses to the etching front, as well as the rate at which etching by-products diffuse away. For example, as discussed above, etchant accesses the sacrificial material 860 of the unreleased interferometric modulators illustrated in FIGS. 8A-8E through etch holes and from the sides of device. Those skilled in the art will understand that the mass transport of the etchant, etching byproducts, and etching intermediates in such devices depends in part on the mean free path, which depends on factors known in the art, for example, on the size of the etching hole(s), the dimensions of the cavity, the shape of the cavity, and the like. In some embodiments, the mean free path changes as the etching proceeds, for example, to regions remote from the etch holes and/or edges of the device. Consequently, in some embodiments, the etching rate of a target material and/or a structural material in a constrained volume, for example, in forming a cavity, is different from the etching rate of the same material in an unconstrained volume, for example, on an outer surface of a device or in a bulk sample of the material. In some embodiments, etching in the constrained volume is slower, for example, when the etching reaction is limited by diffusion of fresh etchant to the etching front. In some embodiments, etching in the constrained volume is faster, for example, when etching byproducts and/or intermediates trapped within the cavity are active etchants. As discussed above, the observed etching rate of a target or structural material depends at least in part on the shape, size, and dimensions of the constrained volume. Because these factors change over the course of an etching reaction, one or more of the etching rates also changes in some embodiments. Such considerations make the a priori determination of an etching rate of a target or structural material under such conditions difficult. Accordingly, in many cases, the etching rates of target and/or structural are determined empirically, for example, on a device-by-device basis.

In some embodiments, etching rates are expressed as average etching rates over an entire etching process. In other embodiments, etching rates are expressed as average etching rates over a portion of an etching process. In other embodiments, etching rates are expressed as rates at one or more particular time points in an etching process. Unless otherwise specified, etching rates disclosed herein are average rates over an entire etching process. Etching rates are also expressible in units of mass per time (e.g., g/sec), amount per time (e.g., mol/sec), volume per time (e.g., mL/sec), and/or distance per time (e.g., μm/sec). Etching rates are typically expressed in distance per time herein, although those skilled in the art will understand that the rates are equivalently expressible using different units.

As discussed above in the etching of the array illustrated in FIGS. 9A-9D, much of the etching of the sacrificial (target) material 960 and the dielectric layer (structural material) of the optical stack 916 occurs in the cavities 980. Accordingly, etching selectivity in the illustrated embodiment is expressible as a ratio between an etching rate of the sacrificial material 960 and an etching rate of the dielectric layer of the optical stack 916 within the cavity 980. In other embodiments, at least one of the target material or structural material is not in a constrained volume. For example, in some embodiments, a target material is disposed in a constrained volume in a device and a structural material of interest is disposed on an exterior of the device, and the relevant relative rate between is between the materials in these environments.

In some embodiments, an etching selectivity between the target material and the structural material in the absence of a co-etchant is at least 20:1, preferably, at least 50:1, more preferably, at least 100:1, most preferably, at least 200:1. In some preferred embodiments, the etching selectivity is at least 300:1, at least 400:1, or at least 500:1. Embodiments of the method include a quantity of a co-etchant effective to improve the selectivity by at least about 2-times, preferably, at least about 4-times, more preferably, at least about 5-times, most preferably, at least about 10-times compared with a similar etching reaction not using a co-etchant. In some embodiments, the improvement in selectivity is at least about 20-times, at least about 50-times, or at least about 100-times.

Some embodiments of interferometric modulator fabrication include a release etch step for a molybdenum layer with about a 20 μm undercut, for example, as illustrated in FIGS. 9A-9D. As discussed above, in some of these embodiments, an underlying $SiO_2$ layer is etched about 500 Å during the etching of the molybdenum. Accordingly, the selectivity of this particular etching reaction is about 400:1 (20 μm/500 Å). In some embodiments of the disclosed etching process, the $SiO_2$ layer is etched by not more than about 50 Å, which translates into an etching selectivity of at least 4000:1, or at least about a 10-time improvement in selectivity. Those skilled in the art will understand that different improvements in selectivity are useful in other embodiments depending on factors known in the art, for example, the identities and morphologies of the target and structural materials, the etchant, the etching conditions, the structure and geometry of the device-to-be-etched, combinations, and the like. As discussed above, in some cases, the selectivity of an etching process is different for materials in an unconstrained volume, for example, for the bulk materials. For example, using $XeF_2$ at room temperature as the etchant, the etching rate of bulk $SiO_2$ is about 1 Å/min and of bulk molybdenum is about 3 μm/min (about 1-5 μm/min), for an etching selectivity of about 30,000:1.

Figure 10:
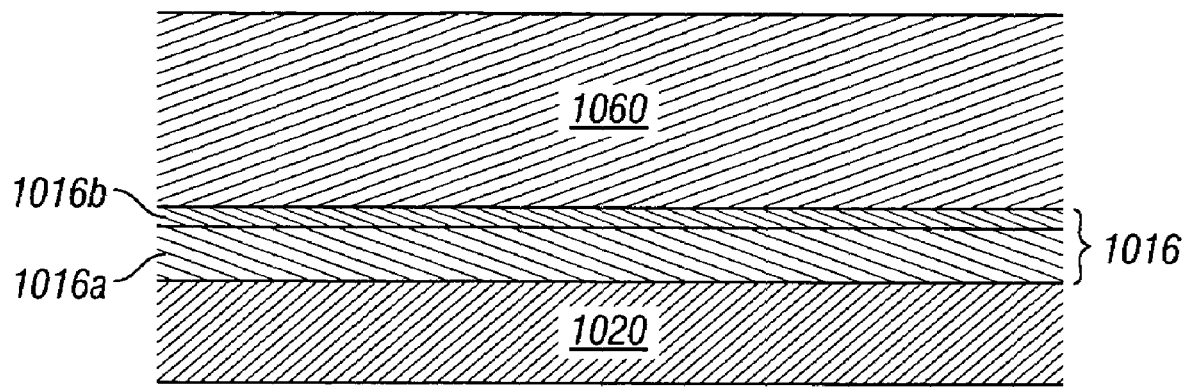
FIG. 10 illustrates in cross section an embodiment of an optical stack comprising an etch stop with a layer of a sacrificial material formed thereupon.

FIG. 10 illustrates an embodiment of an optical stack 1016 formed on a glass substrate 1020. A sacrificial layer 1060 is formed over the optical stack 1016. The optical stack 1016 comprises an etch stop 1016b formed over the dielectric layer 1016a. The etch stop 1016b comprises a material which is more resistant to etching in the release etch than the dielectric layer 1016a. In some embodiments, the etch stop 1016b comprises aluminum oxide ($Al_2O_3$), which is highly resistant to etching in some embodiments of release etch processes, thereby preventing etching of the dielectric layer 1016a. Some embodiments of an aluminum oxide etch stop 1016b exhibit one or more of the following disadvantages, however: additional steps for forming the etch stop layer 1016b, charge trapping in the etch stop layer 1016b, and high surface energy.

Figure 11:
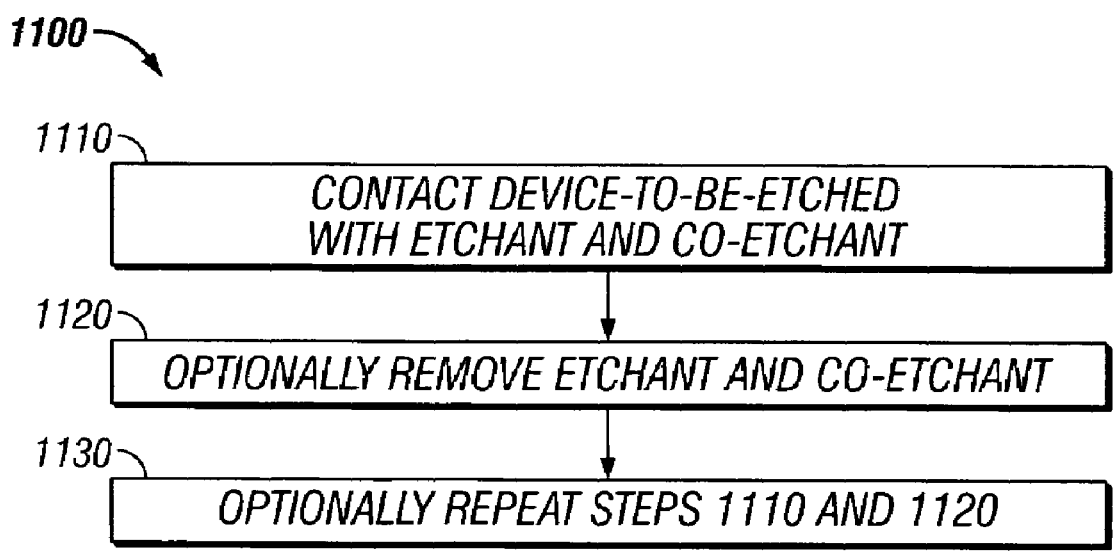
FIG. 11 is a flowchart illustrating an embodiment of a method for etching a target material over a structural material with improved selectivity.

Accordingly, FIG. 11 is a flowchart illustrating an embodiment of an etching method 1100 exhibiting improved selectivity between a target material and a structural material, for example, molybdenum and silicon dioxide, thereby eliminating the need for an etch stop layer to protect the structural material. In step 1110, a device-to-be-etched is contemporaneously contacted with an etchant and a co-etchant. In step 1120, the etchant and co-etchant are optionally removed, for example, by purging with a gas and/or under vacuum. In step 1130, steps 1110 and 1120 are optionally repeated. For example, some embodiments use an etching apparatus with an insufficient volume to hold enough vapor phase etchant to completely etch a device in a single cycle. Some embodiments use different ratios of the vapor phase etchant and co-etchant in different cycles. In some embodiments, purging between etching cycles removes reactive etching byproducts and/or intermediates, thereby improving selectivity. Embodiments of the method are useful for the fabrication of MEMS devices comprising hole or cavities, for example, for the release etch of any of the unreleased interferometric modulators illustrated in FIGS. 8A-8E to form the corresponding released interferometric modulators illustrated in FIGS. 7A-7E.

In some embodiments, the etchant is a vapor phase etchant, for example, one or more gaseous halides known in the art. Examples of suitable gaseous halides include noble gas fluorides, interhalogen fluorides, interhalogen chlorides, $NF_3$, combinations thereof, and the like. In some preferred embodiments, the etchant is $XeF_2$, which is a noble gas fluoride. In some embodiments, the pressure of the etchant over at least a portion of the etching process is from about 0.5 torr to about 500 torr, more preferably, from about 1 torr to about 50 torr, most preferably, from about 2 torr to about 10 torr. Those skilled in the art will understand that in embodiments comprising more than one vapor phase, the pressure is a partial pressure. As the etching proceeds, the partial pressure of the etchant declines. Those skilled in the art will understand that different pressures are suitable for different etchants.

The co-etchant comprises one or more oxygen-containing compounds, one or more sulfur-containing compounds, one or more nitrogen-containing compounds, or combinations thereof. Suitable oxygen-containing compounds include $O_2$, $O_3$, ozonides, peroxides, peracids, superoxides, nitrogen oxides ($N_xO_y$), sulfur oxides ($S_xO_y$), and combinations thereof. Suitable sulfur-containing compounds include thiols, sulfides, thiones, thioic acids, carbon disulfide, OCS, and combinations thereof. Suitable nitrogen-containing compounds include amines, amides, azides, and combinations thereof. In some embodiments, the co-etchant is a vapor phase co-etchant. In some embodiments, the pressure of the co-etchant over at least a portion of the etching process is from about 0.5 torr to about 500 torr, more preferably, from about 1 torr to about 50 torr, most preferably, from about 2 torr to about 10 torr.

In some embodiments, at least a portion of the etching process is performed at from about 0° C. to about 200° C., preferably, from about 10° C. to about 100° C., most preferably from about 20° C. to about 50° C. In some embodiments, the overall pressure over at least a portion of the etching process is from about 0.5 torr to about 1000 torr, preferably, from about 1 torr to about 500 torr, most preferably, from about 5 torr to about 100 torr. Those skilled in the art will understand that the pressure varies with the temperature at which the etching process is performed.

As used herein, the term "vapor phase" refers to compounds for which an effective amount of the compound is in the vapor phase under the etching conditions. As such, in some embodiments, at least some of the compound is not in the vapor phase, that is, is in a condensed phase, for example, solid and/or liquid phases. Methods for generating a vapor phase concentration of a compound are known in the art, for example, heating, sparging, atomizing, irradiating, combinations thereof, and the like.

Suitable target materials include group IVA (14) semiconductors, III-V (13-15) semiconductors, metals, transition metals, and combinations, mixtures, solutions, and alloys thereof. Suitable target materials include silicon, titanium, zirconium, hafnium, vanadium, tantalum, niobium, molybdenum, tungsten, and combinations thereof. In some preferred embodiments, the target material comprises a metal, for example, titanium, zirconium, hafnium, vanadium, tantalum, niobium, molybdenum, tungsten, and combinations thereof. In some more preferred embodiments, the target material comprises molybdenum. Suitable structural materials include metal oxides, nitrides, sulfides, combinations thereof, and the like. Other suitable structural materials include metals, metal alloys, photoresist materials, organic materials, combinations thereof, and the like.

Some embodiments further comprise activation of the etching process, by means known in the art, for example, using thermal, ultrasonic, microwave, ultraviolet (UV), laser, or combination energy.

EXAMPLE 1

Figure 12A:
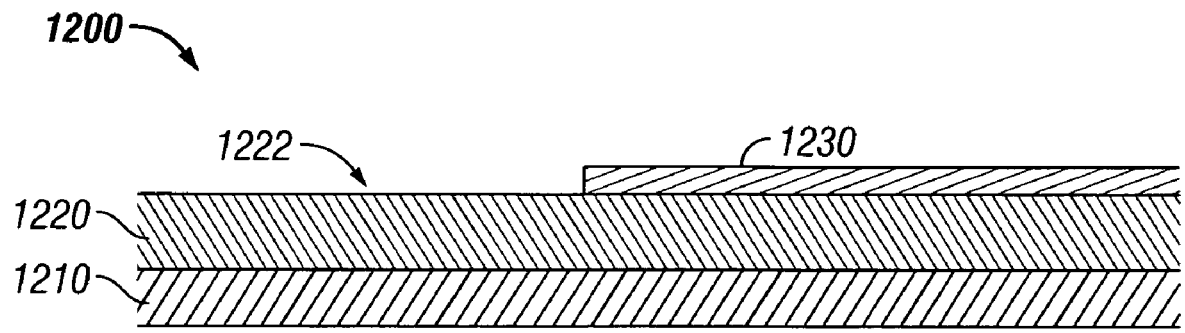
FIGS. 12A-12C illustrate in cross section the etching of a target material and a structural material in a test device.

A series of test devices 1200 illustrated in FIG. 12A were manufactured, each of with comprised a dielectric layer 1210, a molybdenum layer 1220 formed over the dielectric layer 1210, and a photoresist layer 1230 partially covering the molybdenum layer 1220, thereby forming an exposed region 1222. The dielectric layer 1210 was either sputtered silicon dioxide (450 Å±50 Å) or alumina-magnesium oxide-calcium oxide-soda glass. Two different types of molybdenum layers 1220, referred to as low-density and high-density, respectively, were formed on the substrate 1210 by sputtering (physical vapor deposition, PVD). The low-density layer had a density of less than about 5 g/cm$^3$ and a thickness of about 2000 Å. The high-density layer had a density of greater than about 5 g/cm$^3$ and a thickness of about 1700 Å. The photoresist layer 1230 was an I-line photoresist spin-coated and patterned, with a thickness of about 2 μm. These devices 1200 simulate the etching of a target material to form a cavity bounded by structural materials in the manufacture of a MEMS device, for example, in a release etch of an unreleased interferometric modulator as illustrated in FIG. 9A. The exposed region 1222 corresponds, for example, to a partially opened cavity, the photoresist layer 1230 to the deformable layer, the dielectric layer 1210 to the dielectric layer of an optical stack, and the molybdenum layer 1220 to a sacrificial material.

Figure 13:
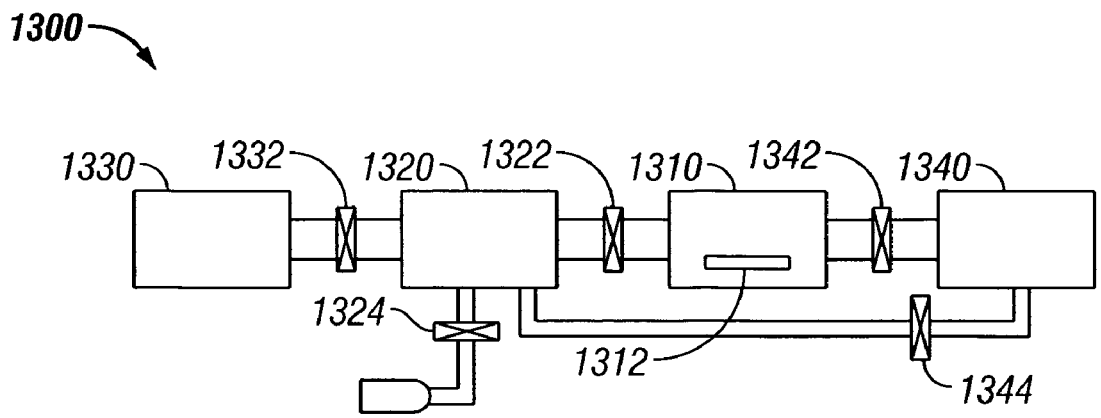
FIG. 13 schematically illustrates an embodiment of an etching apparatus.

Each of the test devices was subjected to etching using XeF$_2$ as the etchant and O$_2$ as the co-etchant in the proportions reported in TABLE I using an etching apparatus 1300 illustrated in FIG. 13. The apparatus 1300 comprises an etching chamber 1310, fluidly connected with an expansion chamber 1320 though a valve 1322. The expansion chamber 1320 is fluidly connected with a XeF$_2$ vessel 1330 through a valve 1332. A vacuum source 1340 is fluidly connected with the etching chamber 1310 through a valve 1342. A substrate support 1312 is disposed in the etching chamber 1310. The expansion chamber 1320 is equipped with a gas inlet, which is controlled by a valve 1324, used, for example, for introducing a vapor phase co-etchant. The vacuum source 1340 and the expansion chamber 1320 are fluidly connected through a valve 1344.

Etching of the test devices was performed as follows. Solid XeF$_2$ was loaded in the XeF$_2$ vessel 1330. A test device was loaded onto the substrate support 1312. One etching cycle comprised the following steps. Valves 1332 and 1344 were opened and the etching chamber 1310 and expansion chamber 1320 evacuated. Valves 1342 and 1344 were closed, then valve 1332 opened to permit XeF$_2$ vapor to fill the expansion chamber 1320. At 25° C., the vapor pressure of XeF$_2$ is about 3.8 Torr (0.5 kPa). Valve 1332 was then closed and O$_2$ mixed with the XeF$_2$ vapor in the expansion chamber though gas inlet valve 1324. Valve 1322 was then opened for a charging time, then closed, thereby filling the etching chamber with and exposing the device to the etchant (XeF$_2$) and co-etchant (O$_2$). After the device was etched for an etching time, valve 1342 was opened to remove the etchant and co-etchant from the etching chamber 1310.

Figure 12B:
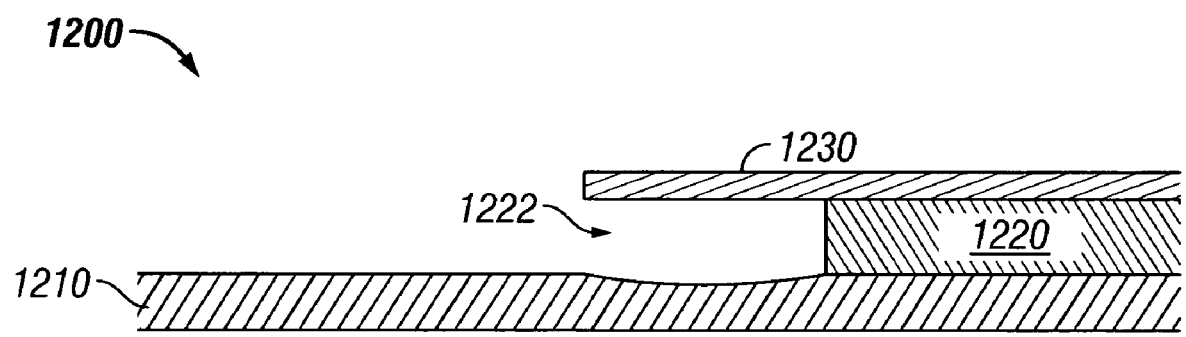

The total pressure of the XeF$_2$+O$_2$ was from about 4 torr to about 50 torr. The etching was performed at room temperature or at about 50° C. with one or two etching cycles, each with a 120 sec charge time and a 300 sec etch time. As illustrated in FIG. 12B, etching the molybdenum layer 1220 forms an undercut 1222 below the photoresist layer 1230. The width of the undercut 1222 was determined by optical microscopy.

Figure 12C:
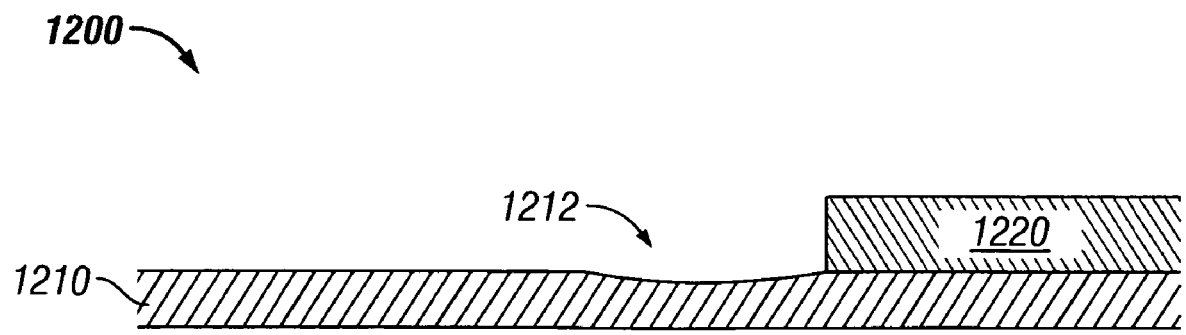

The photoresist 1230 was then stripped using acetone with an isopropanol rinse to provide the structure illustrated in FIG. 12C comprising a molybdenum layer 1220 overlying part of the dielectric layer 1210. The presence and dimensions of a dip 1212 in the dielectric layer 1210 was determined using a Tencor P20 profilometer (KLA-Tencor, San Jose, Calif.). It is believed that the dip 1212 is localized in the undercut area 1222 because the relatively poorer mass transport in this region increases the concentration of reactive etching intermediates and/or by-products, which as discussed below, are believed to contribute to the etching of the structural material. Results are summarized in TABLE 1, where the proportion of O$_2$:XeF$_2$ is on a molar basis, in these experiments, the ratio of their pressures. Each value is the average of three test runs.

TABLE I

| Entry | Mo/dielectric | O$_2$:XeF$_2$ | Undercut (μm) | Dip width (μm) | Dip depth (Å) |
|---|---|---|---|---|---|
| 1 | Low density/SiO$_2$ | 0 | 40 | 47 | 170 |
| 2 | Low density/SiO$_2$ | 1 | 35 | 40 | 110 |
| 3 | Low density/SiO$_2$ | 10 | 35 | 41 | 90 |
| 4 | High density/glass | 0 | 15 | 18 | 110 |
| 5 | High density/glass | 1 | 18 | no dip | no dip |
| 6 | High density/glass | 10 | 12 | no dip | no dip |

Figure 14A:
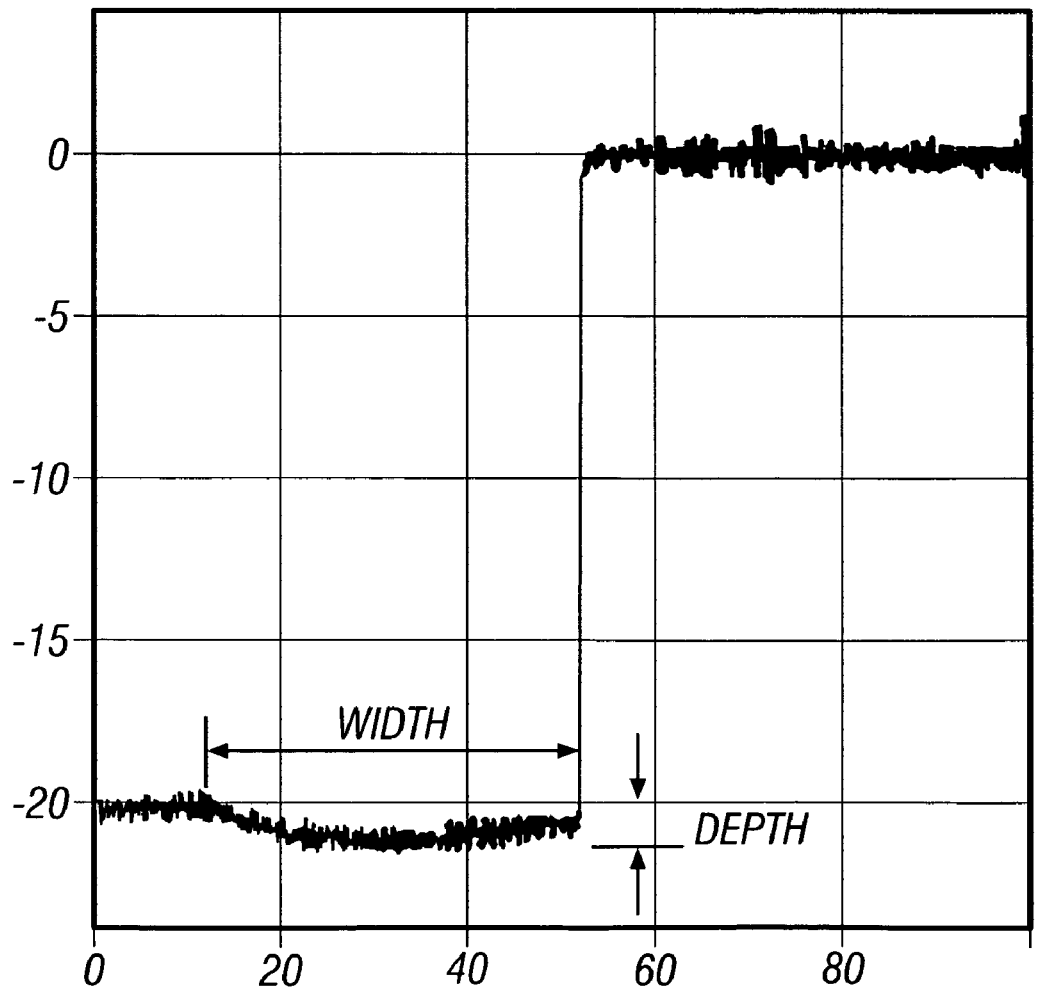
FIGS. 14A and 14B illustrate comparative profilometry results of devices etched according to embodiments of the disclosed etching method.
Figure 14B:
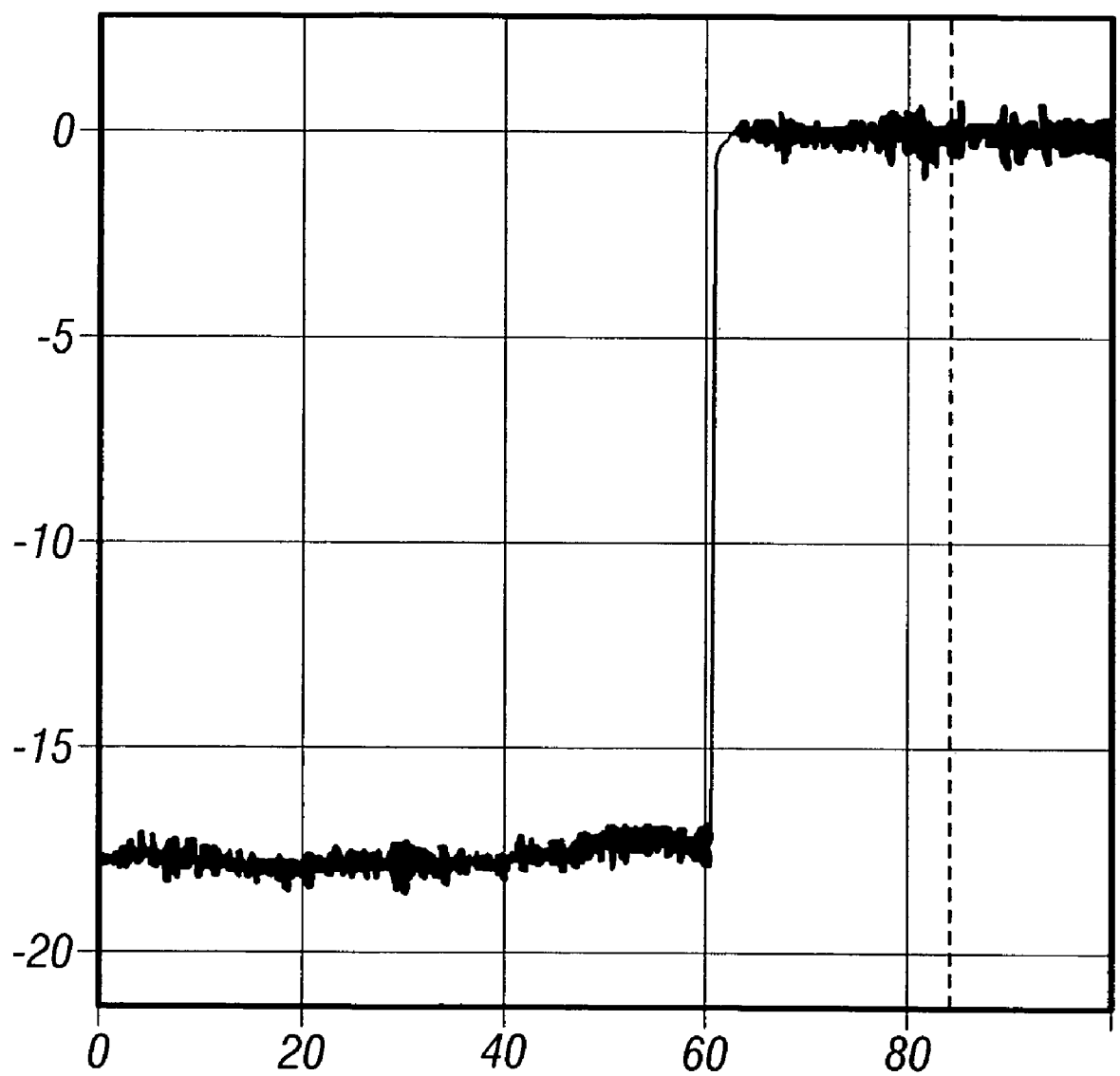

Profilometry results for experiments 1 and 6 are illustrated in FIGS. 14A and 14B, respectively. As shown in TABLE I, the co-etchant improved the selectivity of the etching in both types of test devices, and increasing the amount of co-etchant increased the selectivity. Moreover, adding the co-etchant did not significantly change the etch rate compared with the etch rate without a co-etchant. X-ray photoelectron spectroscopy (XPS) and secondary ion mass spectroscopy (SIMS) analyses of the etched test devices 1200 indicate fluorine incorporation in the dielectric layer 1210 in the undercut area 1222, even in the cases in which no dip was observed.

The following discusses a system in which the target material is molybdenum, the structural material is silicon dioxide, the etchant is XeF$_2$, and the co-etchant is O$_2$. Those skilled in the art will understand that the principles are also applicable to other etching systems.

The reaction between XeF$_2$ and Mo produces MoF$_6$ in the vapor phase as the principal product (Eq. 1).

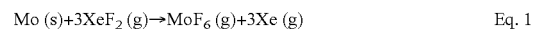

$$\text{Mo (s)} + 3\text{XeF}_2 \text{(g)} \rightarrow \text{MoF}_6 \text{(g)} + 3\text{Xe (g)} \qquad \text{Eq. 1}$$

This reaction also forms lower molybdenum fluorides (MoF$_x$, x=1-5) as byproducts.

Without being bound by any theory, it is believed that the silicon dioxide is etched by some combination of two mechanisms: direct etching by XeF$_2$ and/or etching by reactive molybdenum fluoride species. The reaction of silicon dioxide with XeF$_2$ is thermodynamically favorable, but kinetically unfavorable (Eq. 2).

$$SiO_2(s) + 2XeF_2(g) \rightarrow SiF_4(g) + 2Xe(g) + O_2(g) \: \Delta H° = -358 \text{ kJ/mol} \qquad \text{Eq. 2}$$

Also formed in the etching process are unstable intermediates generated from $XeF_2$, for example, $XeF^-$ and $F^-$, as well as lower silicon fluorides ($SiF_y$, y=1-3). It is believed that these species, as well as the lower molybdenum fluoride species discussed above can react with or activate $SiO_2$. The reaction of $MoF_6$ with $SiO_2$ to form $SiF_4$ is also thermodynamically favorable (Eq. 3).

$$SiO_2(s) + 2MoF_6(g) \rightarrow SiF_4(g) + 2MoOF_4(g) \Delta H° = -99 \text{ kJ/mol} \qquad \text{Eq. 3}$$

It is believed that $MoOF_4$ does not react with $SiO_2$ under the etching conditions because the reaction is thermodynamically unfavorable (Eq. 4).

$$SiO_2(s) + 2MoOF_4(g) \rightarrow SiF_4(g) + 2MoO_2F_2(g) \Delta H° = +378 \text{ kJ/mol} \qquad \text{Eq. 4}$$

These mechanisms are consistent with the observation of the dip 1212 in the undercut area 1222 illustrate in FIGS. 12B and 12C. Diffusion of etching intermediates and/or byproducts is shower in the undercut area 1222. Longer contact time between these reactive species and the dielectric layer 1210 in this area results in increased etching compared with areas with no overhang, thereby forming the dip 1212.

Accordingly, it is believed that one mechanism through which $O_2$ improves selectivity in the etching process by changing the terminal molybdenum-containing product from $MoF_6$, which reacts with $SiO_2$, to $MoOF_4$, which does not reacts with $SiO_2$ (Eq. 5).

$$2Mo(s) + 4XeF_2(g) + O_2(g) \rightarrow 2MoOF_4(g) + 4Xe(g) \qquad \text{Eq. 5}$$

It is also believed that the $O_2$ reacts with other reactive species present, for example, $XeF^-$, $F^-$, $MoO_x$, and/or $SiF_y$, to produce less reactive products. Furthermore, because one of the products in the reaction of $XeF_2$ with $SiO_2$ (Eq. 2) is $O_2$, it is believed that adding $O_2$ inhibits this reaction by mass action.

Those skilled in the art will understand that changes in the apparatus and manufacturing process described above are possible, for example, adding and/or removing components and/or steps, and/or changing their orders. Moreover, the methods, structures, and systems described herein are useful for fabricating other electronic devices, including other types of MEMS devices, for example, other types of optical modulators.

Moreover, while the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method for fabricating a microelectromechanical systems device comprising:
   providing a substrate in an etching chamber;
   contacting a microelectromechanical systems device formed on the substrate with a vapor phase etchant comprising a gaseous halide and a co-etchant by flowing the vapor phase etchant and the co-etchant into the etching chamber, wherein
   the microelectromechanical systems device comprises a target material and a structural material;
   the target material and the structural material are both etchable by the gaseous halide with an etching selectivity between the target material and the structural material of at least about 50:1 in the absence of the co-etchant; and
   the co-etchant is present in an amount effective to improve the etching selectivity between the target material and the structural material by at least about 2-times compared with the etching selectivity in the absence of the co-etchant.

2. The method of claim 1, wherein the gaseous halide comprises a compound selected from the group consisting of noble gas fluorides, interhalogen fluorides, interhalogen chlorides, $NF_3$, and combinations thereof.

3. The method of claim 2, wherein the gaseous halide is $XeF_2$.

4. The method of claim 1, wherein the target material comprises a metal.

5. The method of claim 4, wherein the metal is selected from the group consisting of titanium, zirconium, hafnium, vanadium, tantalum, niobium, molybdenum, tungsten, and combinations thereof.

6. The method of claim 5, wherein the metal comprises molybdenum.

7. The method of claim 1, wherein the structural material comprises a dielectric material.

8. The method of claim 7, wherein the dielectric material comprises $SiO_2$.

9. The method of claim 1, wherein the co-etchant comprises an oxygen-containing compound.

10. The method of claim 9, wherein the oxygen-containing compound is selected from the group consisting of $O_2$, $O_3$, ozonides, peroxides, peracids, superoxides, $N_xO_y$, $S_xO_y$, and combinations thereof.

11. The method of claim 10, wherein the oxygen-containing compound comprises $O_2$.

12. The method of claim 1, wherein the co-etchant comprises a nitrogen-containing compound.

13. The method of claim 12, wherein the nitrogen-containing compound is selected from the group consisting of amines, amides, azides, and combinations thereof.

14. The method of claim 1, wherein the co-etchant comprises a sulfur-containing compound.

15. The method of claim 14, wherein the co-etchant comprises an sulfur-containing compound selected from the group consisting of thiols, sulfides, thiones, thioic acids, carbon disulfide, OCS, and combinations thereof.

16. The method of claim 1, wherein a ratio between the co-etchant and etchant is at least about 1:1.

17. The method of claim 16, wherein a ratio between the co-etchant and etchant is at least about 10:1.

18. The method of claim 1, wherein the etching selectivity between the target material and the structural material of at least about 100:1 in the absence of a co-etchant.

19. The method of claim 1, wherein the etching selectivity between the target material and the structural material in the presence of the co-etchant is at least 4-times the etching selectivity between the target material and the structural material in the absence of the co-etchant.

20. The method of claim 19, wherein the etching selectivity between the target material and the structural material in the presence of the co-etchant is at least 10-times the etching selectivity between the target material and the structural material in the absence of the co-etchant.

21. The method of claim 1, wherein a pressure of the vapor phase etchant is from about 0.5 torr to about 400 torr for at least a portion of the etching process.

22. The method of claim 1, wherein a temperature is from about 0° C. to about 200° C. for at least a portion of the etching process.

23. The method of claim 1, wherein the microelectromechanical systems device comprises an interferometric modulator, wherein
at least a portion of the target material is a sacrificial material that after etching defines a cavity, and
at least a portion of the structural material is a dielectric material disposed on a stationary electrode.

24. A microelectromechanical (MEMS) device fabricated by the method of claim 1.

25. A method for fabricating a microelectromechanical systems device comprising:
contacting a microelectromechanical systems device with a vapor phase etchant means and a co-etchant means, wherein
the microelectromechanical systems device comprises a metal target material and a structural material; and
the co-etchant means is present in an amount effective to improve an etching selectivity between the target material and the structural material by at least 2-times compared with an etching selectivity between the target material and the structural material in the absence of the co-etchant means.

26. A method for fabricating an interferometric modulator comprising:
contacting an unreleased interferometric modulator with a vapor phase etchant and a vapor phase co-etchant, wherein
the unreleased interferometric modulator comprises a sacrificial material in contact with a dielectric material, and
at least a portion of the sacrificial material when etched away forms a cavity; and
etching away substantially all of the at least a portion of the sacrificial material, wherein the co-etchant is present in an amount sufficient to improve the etching selectivity between the sacrificial material and the dielectric material by at least 2-times.

27. The method of claim 26, wherein the sacrificial material comprises a metal selected from the group consisting of titanium, zirconium, hafnium, vanadium, tantalum, niobium, molybdenum, tungsten, and combinations thereof.

28. The method of claim 27, wherein the sacrificial material comprises molybdenum.

29. The method of claim 26, wherein the vapor phase etchant comprises a gaseous halide selected from the group consisting of noble gas fluorides, interhalogen fluorides, interhalogen chlorides, $NF_3$, and combinations thereof.

30. The method of claim 29, wherein the vapor phase etchant comprises $XeF_2$.

31. The method of claim 26, wherein the vapor phase co-etchant comprises a compound selected from the group consisting of oxygen-containing compounds, nitrogen containing compounds, and sulfur containing compounds.

32. The method of claim 31, wherein the vapor phase co-etchant comprises $O_2$.

33. The method of claim 26, wherein:
the etching selectivity between the sacrificial material and the dielectric material in the absence of the co-etchant is at least 400:1; and
the co-etchant is present in an amount sufficient to improve the etching selectivity between the sacrificial material and the dielectric material by at least 10-times.

34. The method of claim 26, wherein the etching away substantially all of the at least a portion of the sacrificial material is performed in a single etching cycle.

35. The method of claim 3, wherein
the target material comprises a metal selected from the group of titanium, zirconium, hafnium, vanadium, tantalum, niobium, molybdenum, tungsten, and combinations thereof; and
the co-etchant comprises an oxygen-containing compound selected from the group of $O_2$, $O_3$, ozonides, peroxides, peracids, superoxides, $N_xO_y$, $S_xO_y$, and combinations thereof.

36. The method of claim 3, wherein
the target material comprises a metal selected from the group of titanium, zirconium, hafnium, vanadium, tantalum, niobium, molybdenum, tungsten, and combinations thereof; and
the co-etchant comprises a nitrogen-containing compound selected from the group of amines, amides, azides, and combinations thereof.

37. The method of claim 3, wherein
the target material comprises a metal selected from the group of titanium, zirconium, hafnium, vanadium, tantalum, niobium, molybdenum, tungsten, and combinations thereof; and
the co-etchant comprises a sulfur-containing compound selected from the group of thiols, sulfides, thiones, thioic acids, carbon disulfide, OCS, and combinations thereof.

* * * * *

UNITED STATES PATENT AND TRADEMARK OFFICE
CERTIFICATE OF CORRECTION

| | | |
|---|---|---|
| PATENT NO. | : 7,566,664 B2 | |
| APPLICATION NO. | : 11/497726 | |
| DATED | : July 28, 2009 | |
| INVENTOR(S) | : Yan et al. | |

It is certified that error appears in the above-identified patent and that said Letters Patent is hereby corrected as shown below:

At column 3, line 9, after "structural", please insert --material--.

At column 7, line 23, after "appropriate", please insert --Column to -$V_{bias}$, and the appropriate row to +$\Delta V$, which may correspond to -5 volts and +5--.

Signed and Sealed this
Thirty-first Day of January, 2012

David J. Kappos
*Director of the United States Patent and Trademark Office*